(12) United States Patent
Sandhu et al.

(10) Patent No.: US 7,455,956 B2
(45) Date of Patent: Nov. 25, 2008

(54) METHOD TO ALIGN MASK PATTERNS

(75) Inventors: Gurtej S Sandhu, Boise, ID (US);
Randal W Chance, Boise, ID (US);
William T Rericha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 11/691,192

(22) Filed: Mar. 26, 2007

(65) Prior Publication Data
US 2007/0190463 A1 Aug. 16, 2007

Related U.S. Application Data

(63) Continuation of application No. 10/934,317, filed on Sep. 2, 2004.

(51) Int. Cl.
G03F 7/00 (2006.01)
B44C 1/22 (2006.01)
H01L 21/469 (2006.01)

(52) U.S. Cl. ............... 430/313; 430/311; 430/314; 430/322; 430/323; 216/41; 216/46; 438/975

(58) Field of Classification Search ............ 430/311, 430/313, 314, 316, 322, 323; 216/41, 46; 438/717, 710, 942, 948, 975
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,053,105 A | 10/1991 | Fox, III | |

(Continued)

FOREIGN PATENT DOCUMENTS

DE  42 36 609 A1  5/1994

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner*—Thorl Chea
(74) *Attorney, Agent, or Firm*—Knobbe Martens Olson & Bear LLP

(57) ABSTRACT

Alignment tolerances between narrow mask lines, for forming interconnects in the array region of an integrated circuit, and wider mask lines, for forming interconnects in the periphery of the integrated circuit, are increased. The narrow mask lines are formed by pitch multiplication and the wider mask lines are formed by photolithography. The wider mask lines and are aligned so that one side of those lines is flush with or inset from a corresponding side of the narrow lines. Being wider, the opposite sides of the wider mask lines protrude beyond the corresponding opposite sides of the narrow mask lines. The wider mask lines are formed in negative photoresist having a height less than the height of the narrow mask lines. Advantageously, the narrow mask lines can prevent expansion of the mask lines in one direction, thus increasing alignment tolerances in that direction. In the other direction, use of photolithography and a shadowing effect caused by the relative heights of the photoresist and the narrow mask lines causes the wider mask lines to be formed with a rounded corner, thus increasing alignment tolerances in that direction by increasing the distance to a neighboring narrow mask line.

25 Claims, 35 Drawing Sheets

U.S. PATENT DOCUMENTS

| | | |
|---|---|---|
| 5,117,027 A | 5/1992 | Bernhardt et al. |
| 5,328,810 A | 7/1994 | Lowrey et al. |
| 5,330,879 A | 7/1994 | Dennison |
| 5,514,885 A | 5/1996 | Myrick |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,998,256 A | 12/1999 | Juengling |
| 6,004,862 A | 12/1999 | Kim et al. |
| 6,010,946 A | 1/2000 | Hisamune et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,211,044 B1 | 4/2001 | Xiang et al. |
| 6,288,454 B1 | 9/2001 | Allman et al. |
| 6,291,334 B1 | 9/2001 | Somekh |
| 6,297,554 B1 | 10/2001 | Lin |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,632,741 B1 | 10/2003 | Clevenger et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,744,094 B2 | 6/2004 | Forbes |
| 6,773,998 B1 | 8/2004 | Fisher et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,962,867 B2 | 11/2005 | Jackson et al. |
| 7,015,124 B1 | 3/2006 | Fisher et al. |
| 7,074,668 B1 | 7/2006 | Park et al. |
| 7,183,597 B2 | 2/2007 | Doyle |
| 7,208,379 B2 | 4/2007 | Venugopal et al. |
| 7,291,560 B2 | 11/2007 | Parascandola et al. |
| 2002/0042198 A1 | 4/2002 | Bjamason et al. |
| 2002/0045308 A1 | 4/2002 | Juengling |
| 2002/0063110 A1 | 5/2002 | Cantell et al. |
| 2002/0127810 A1 | 9/2002 | Nakamura et al. |
| 2003/0006410 A1 | 1/2003 | Doyle |
| 2003/0044722 A1 | 3/2003 | Hsu et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0230234 A1 | 12/2003 | Nam et al. |
| 2004/0000534 A1 | 1/2004 | Lipinski |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0186705 A1 | 8/2005 | Jackson et al. |
| 2005/0272259 A1 | 12/2005 | Hong |
| 2006/0024945 A1 | 2/2006 | Kim et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0172540 A1 | 8/2006 | Marks et al. |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0026672 A1 | 2/2007 | Tang et al. |
| 2007/0045712 A1 | 3/2007 | Haller et al. |
| 2007/0048674 A1 | 3/2007 | Wells |
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0210449 A1 | 9/2007 | Caspary et al. |
| 2007/0215960 A1 | 9/2007 | Zhu et al. |
| 2007/0275309 A1 | 11/2007 | Liu |

FOREIGN PATENT DOCUMENTS

| | | |
|---|---|---|
| EP | 0227303 | 7/1987 |
| EP | 0491408 | 6/1992 |
| EP | 1357433 | 10/2003 |
| JP | 05343370 | 12/1993 |
| JP | H8-55908 | 2/1996 |
| JP | H8-55920 | 2/1996 |
| WO | WO 02/099864 A1 | 12/2002 |
| WO | WO 2004/001799 A2 | 12/2003 |
| WO | WO 2004/003977 A2 | 1/2004 |
| WO | WO 2005/034215 A1 | 4/2005 |
| WO | WO 2006/026699 | 3/2006 |

OTHER PUBLICATIONS

Bhave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectric materials by high-density plasma etching," Solid State Tech., May 2000, 8 pages.

"U.S. Appl. No. 11/543,515, filed Oct. 24, 2006, Micron Ref. No. 2005-1173.00/US."

Ex Parte Cantell, unpublished decision of the Board of Patent Appeals and Interferences, Mar. 4, 2005.

Choi et al., "Sublithographic nanofabrication technology for nanocatalysts and DNA chips," *J.Vac. Sci. Technol.*, pp. 2951-2955 (Nov./Dec. 2003).

METHOD TO ALIGN MASK PATTERNS

PRIORITY CLAIM

This application is a continuation of U.S. patent application Ser. No. 10/934,317, filed Sep. 2, 2004.

REFERENCE TO RELATED APPLICATIONS

This application is related to the following: U.S. patent application Ser. No. 10/931,772 to Abatchev et al., filed Aug. 31, 2004; U.S. patent application Ser. No. 10/932,993 to Abatchev et al., filed Sep. 1, 2004; U.S. Pat. No. 7,115,525 to Abatchev et al., issued Oct. 3, 2006; and U.S. Pat. No. 7,151,040 to Tran et al., issued Dec. 19, 2006.

BACKGROUND OF THE INVENTION

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency in modern electronics, integrated circuits are continuously being reduced in size. To facilitate this size reduction, the sizes of the constituent features, such as electrical devices and interconnect line widths, that form the integrated circuits are also constantly being decreased.

The trend of decreasing feature size is evident, for example, in memory circuits or devices such as dynamic random access memories (DRAMs), static random access memories (SRAMs), ferroelectric (FE) memories, etc. To take one example, DRAM typically comprises millions of identical circuit elements, known as memory cells. In its most general form, a memory cell typically consists of two electrical devices: a storage capacitor and an access field effect transistor. Each memory cell is an addressable location that can store one bit (binary digit) of data. A bit can be written to a cell through the transistor and read by sensing charge on the storage electrode from the reference electrode side. By decreasing the sizes of constituent electrical devices and the conducting lines that access them, the sizes of the memory devices incorporating these features can be decreased. Additionally, storage capacities can be increased by fitting more memory cells into the memory devices.

The continual reduction in feature sizes places ever greater demands on techniques used to form the features. For example, photolithography is commonly used to pattern features, such as conductive lines, on a substrate. The concept of pitch can be used to describe the size of these features. Pitch is defined as the distance between an identical point in two neighboring features. These features are typically defined by spaces between adjacent features, which are typically filled by a material, such as an insulator. As a result, pitch can be viewed as the sum of the width of a feature and of the width of the space separating that feature from a neighboring feature. Due to factors such as optics and light or radiation wavelength, however, photolithography techniques each have a minimum pitch below which a particular photolithographic technique cannot reliably form features. Thus, the minimum pitch of a photolithographic technique can limit feature size reduction.

"Pitch doubling" is one method proposed for extending the capabilities of photolithographic techniques beyond their minimum pitch. Such a method is illustrated in FIGS. 1A-1F and described in U.S. Pat. No. 5,328,810, issued to Lowrey et al., the entire disclosure of which is incorporated herein by reference. With reference to FIG. 1A, photolithography is first used to form a pattern of lines 10 in a photoresist layer overlying a layer 20 of an expendable material and a substrate 30. As shown in FIG. 1B, the pattern is then transferred by an etch step (preferably anisotropic) to the layer 20, forming placeholders, or mandrels, 40. The photoresist lines 10 can be stripped and the mandrels 40 can be isotropically etched to increase the distance between neighboring mandrels 40, as shown in FIG. 1C. A layer 50 of material is subsequently deposited over the mandrels 40, as shown in FIG. 1D. Spacers 60, i.e., material extending or originally formed extending from sidewalls of another material, are then formed on the sides of the mandrels 40 by preferentially etching the spacer material from the horizontal surfaces 70 and 80 in a directional spacer etch, as shown in FIG. 1E. The remaining mandrels 40 are then removed, leaving behind the freestanding spacers 60, which together act as an etch mask for patterning underlying layers, as shown in FIG. 1F. Thus, where a given pitch formerly included a pattern defining one feature and one space, the same width now includes two features and two spaces defined by the spacers 60. As a result, the smallest feature size possible with a photolithographic technique is effectively decreased.

It will be appreciated that while the pitch is actually halved in the example above, this reduction in pitch is conventionally referred to as pitch "doubling," or, more generally, pitch "multiplication." That is, conventionally "multiplication" of pitch by a certain factor actually involves reducing the pitch by that factor. The conventional terminology is retained herein.

The critical dimension of a mask scheme or circuit design is the scheme's minimum feature dimension. Due to factors such as geometric complexity and different requirements for critical dimensions in different parts of an integrated circuit, typically not all features of the integrated circuit will be pitch multiplied. Consequently, pitch multiplied features will often need to be connected to or otherwise aligned with respect to non-pitch multiplied features in some part of the integrated circuit. Because these non-pitch multiplied features generally have larger critical dimensions than the pitch multiplied features, the margin of error for aligning the non-pitch multiplied features to contact the pitch multiplied features can be small. Moreover, because the critical dimensions of pitch-multiplied lines may be near the resolution and/or overlay limits of many photolithographic techniques, shorting neighboring pitch multiplied features is an ever-present possibility. Such shorts can undesirably cause the integrated circuit to malfunction.

Accordingly, there is a need for methods which allow increased margins of error for forming contacts between features of different sizes, especially for forming contacts between pitch multiplied and non-pitch multiplied features.

SUMMARY OF THE INVENTION

According to one aspect of the invention, a method is provided for forming an integrated circuit. The method comprises providing a substrate with an overlying temporary layer and a photodefinable layer overlying the temporary layer. A pattern is formed in the photodefinable layer and transferred to the temporary layer to form a plurality of placeholders in the temporary layer. A blanket layer of spacer material is then deposited over the plurality of placeholders. The spacer material is selectively removed from horizontal surfaces. The placeholders are selectively removed relative to the spacer material to form a plurality of spacer loops. The spacer loops are etched to form a pattern of separated spacers. An other photodefinable layer is formed around and on the same level as the separated spacers. Interconnects are patterned in the other photodefinable layer. The interconnects are wider than the spacers and contact the spacers and are aligned with one long side of the interconnects inset from or collinear with a corresponding long side of the spacers.

According to another aspect of the invention, a method is provided for semiconductor fabrication. The method comprises providing a substrate and forming an elongated spacer over the substrate by pitch multiplication. A photoresist line is then formed. The photoresist line is in contact with an end of the spacer in a contact region. The spacer forms a boundary for only two faces of the photoresist line in the contact region.

According to yet another aspect of the invention, a process is provided for fabricating an integrated circuit. The process comprises forming a first plurality of mask lines and forming a photodefinable layer around the mask lines. The photodefinable layer has a thickness less than a height of the mask lines. A plurality of features is patterned in the photodefinable layer.

According to another aspect of the invention, a partially fabricated integrated circuit is provided. The partially fabricated integrated circuit comprises a substrate and a first plurality of mask lines overlying the substrate. A photodefinable layer contacts the mask lines. The photodefinable layer has a thickness less than a height of the mask lines.

According to yet another aspect of the invention, an integrated circuit is provided. The integrated circuit comprises a plurality of interconnects, each having a first portion with a first width in an array region and a second portion with a second width in a periphery region. The second width is larger than the first width. An end of each of the second interconnect portions contacts an end of each of the first interconnect portions. One side of each of the second interconnect portions, extending along a length of one of the second interconnect portions, is substantially collinear with or inset from one side of each of the first interconnect portions, extending along a length of one of the first interconnect portions.

According to another aspect of the invention, an integrated circuit is provided. The integrated circuit comprises a plurality of interconnects each having a first portion and a second portion. The first portion of the interconnects are substantially parallel to each other between first and second spaced planes extending perpendicular to the lines. In addition, the first portion and the second portion contact in an overlap region. Only one corner of the second portion protrudes beyond a side of the first portion in the overlap region.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
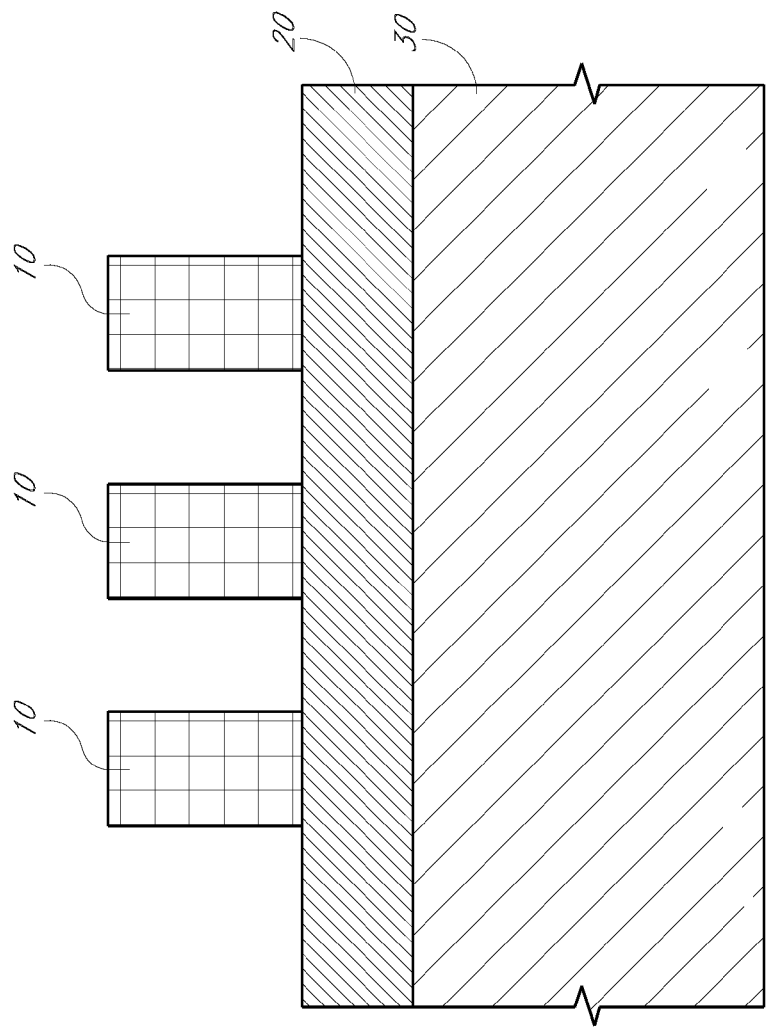
FIGS. 1A-1F are schematic, cross-sectional side views of mask lines, formed in accordance with a prior art pitch multiplication method.
Figure 1B:
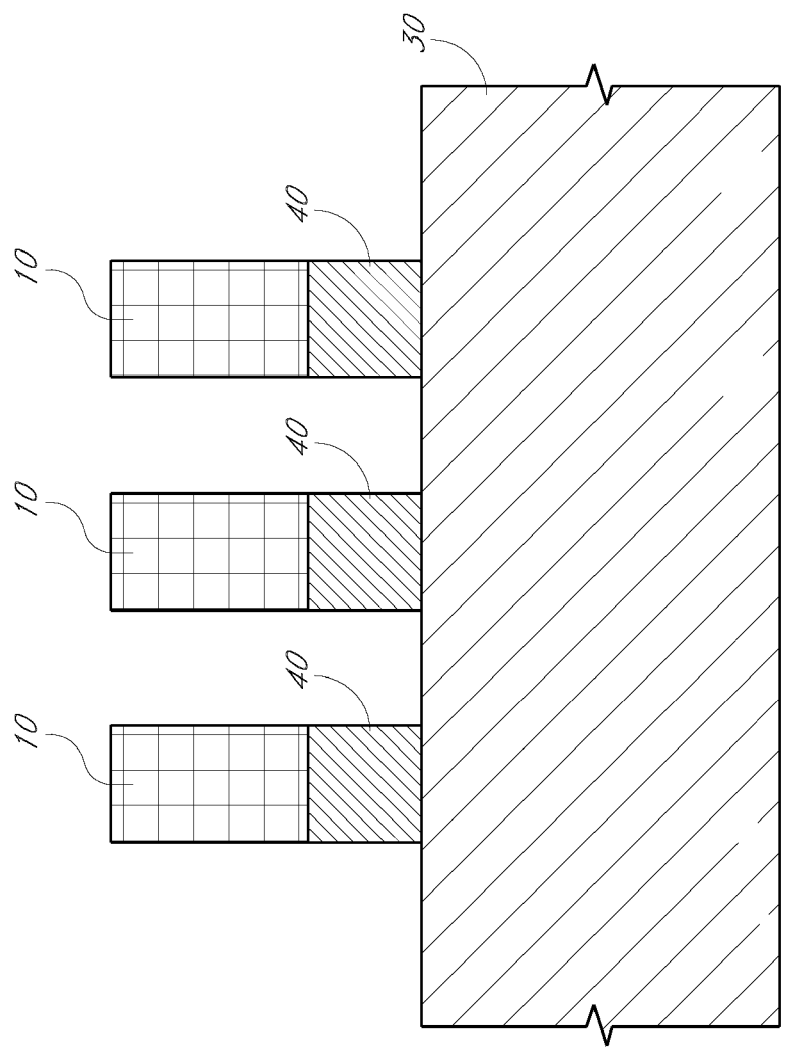
Figure 1C:
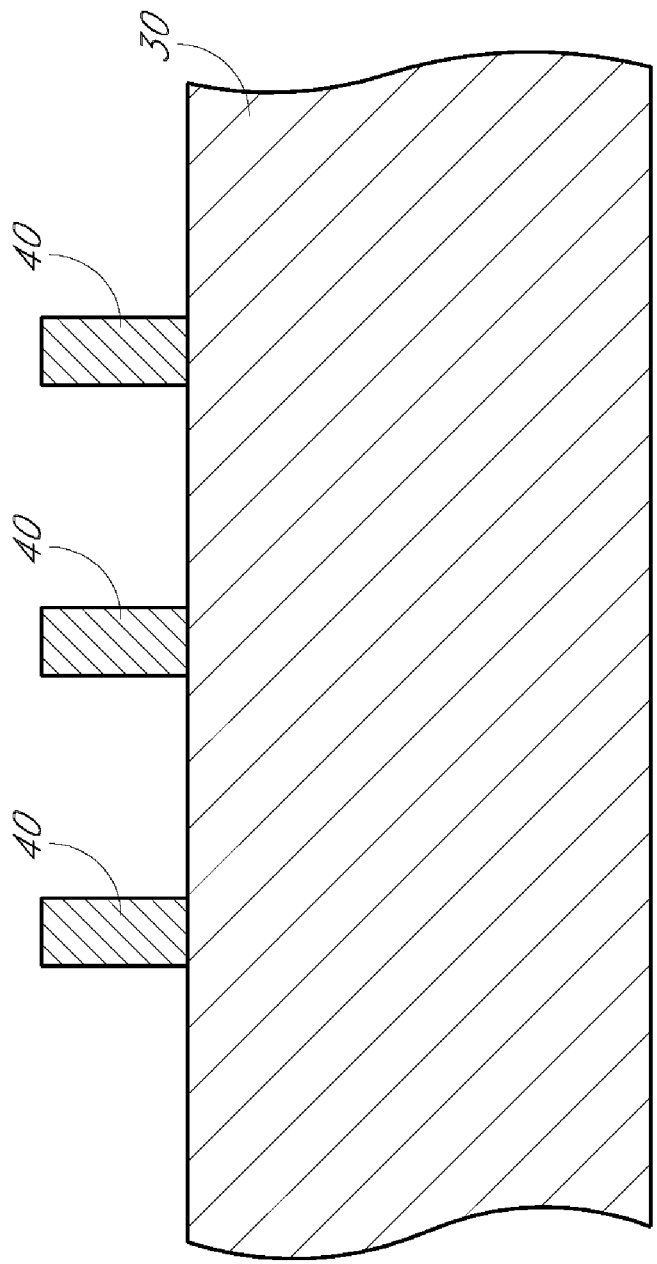
Figure 1D:
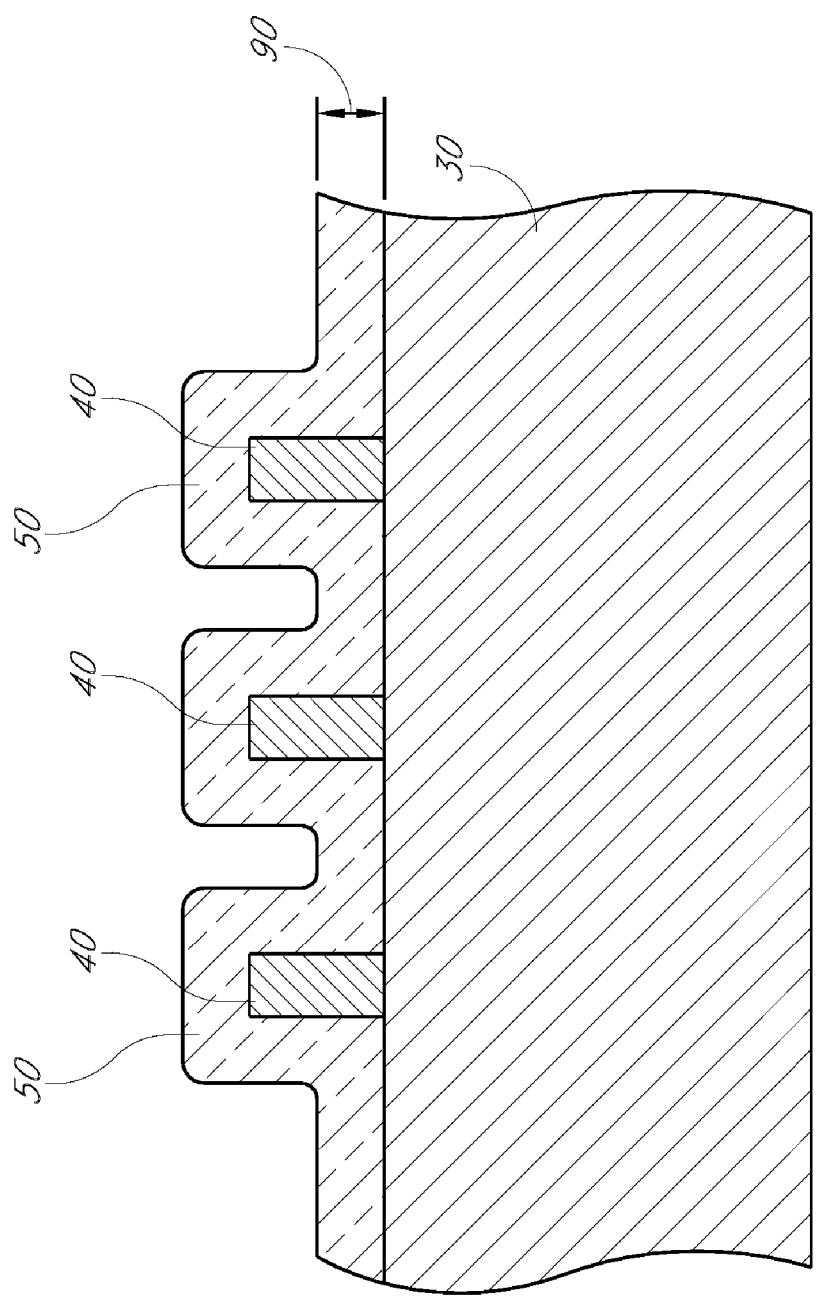
Figure 1E:
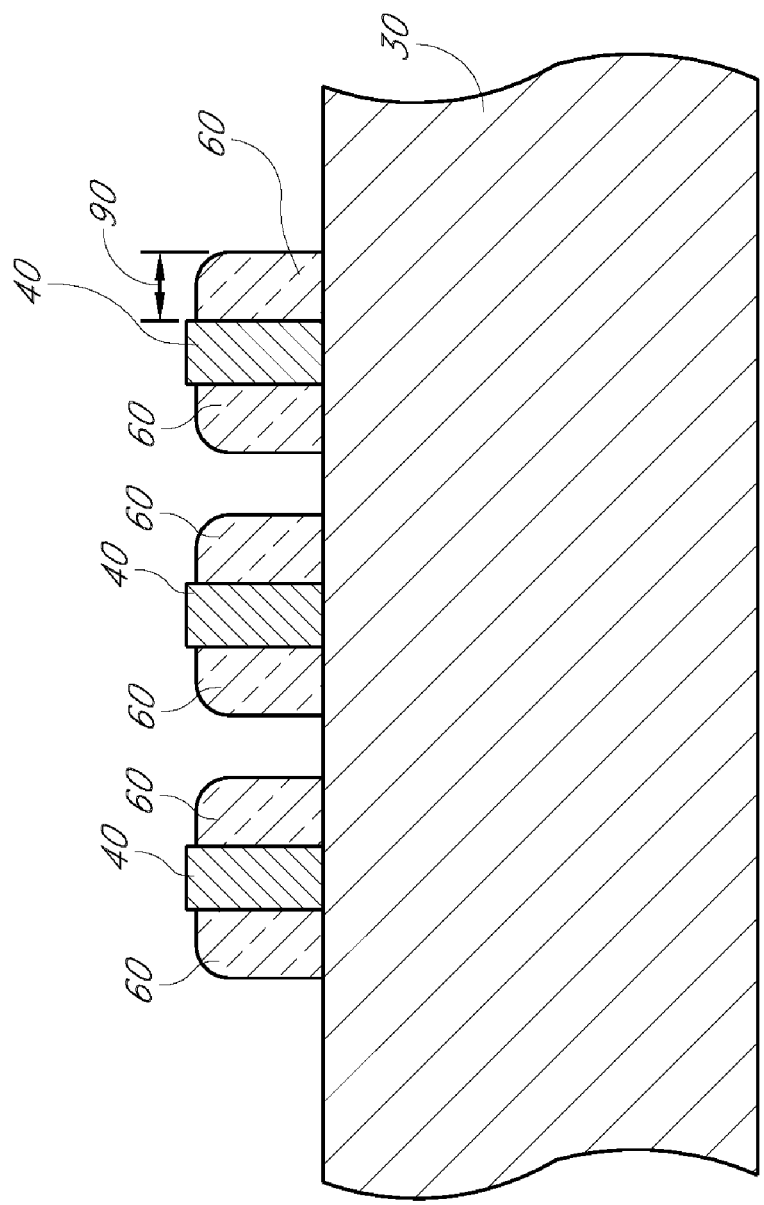
Figure 1F:
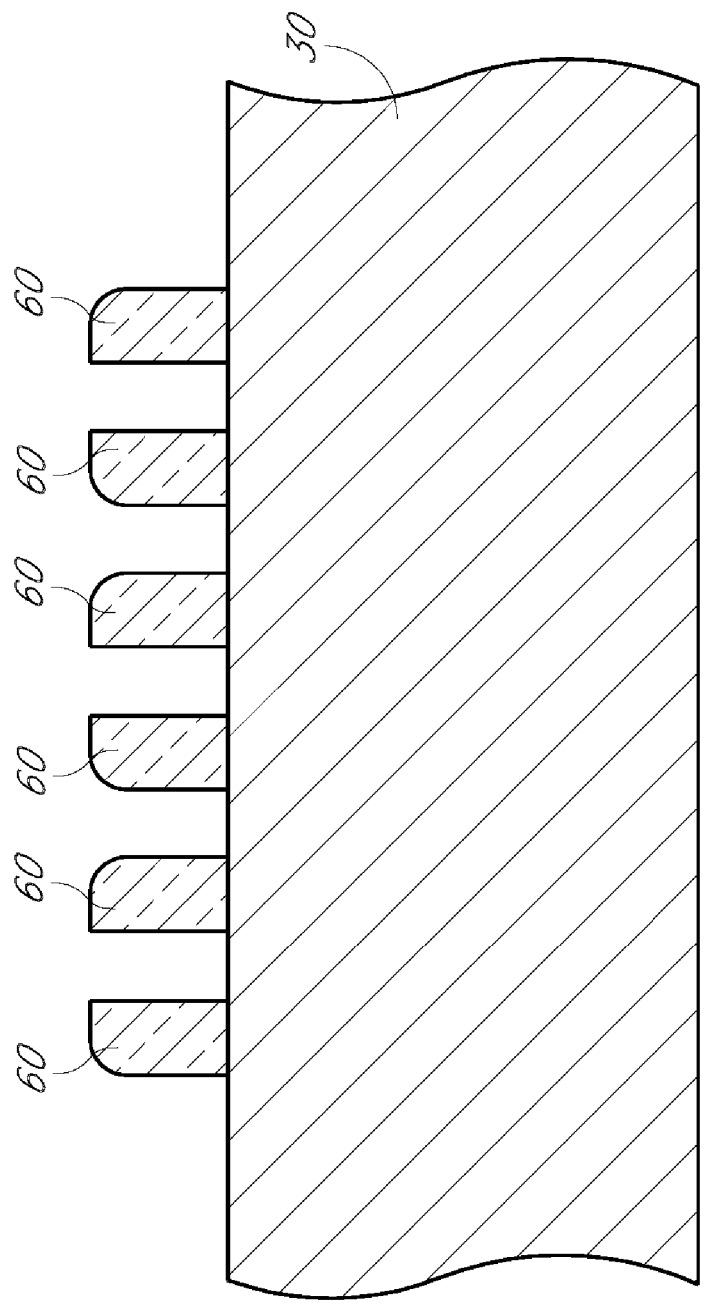
Figure 2A:
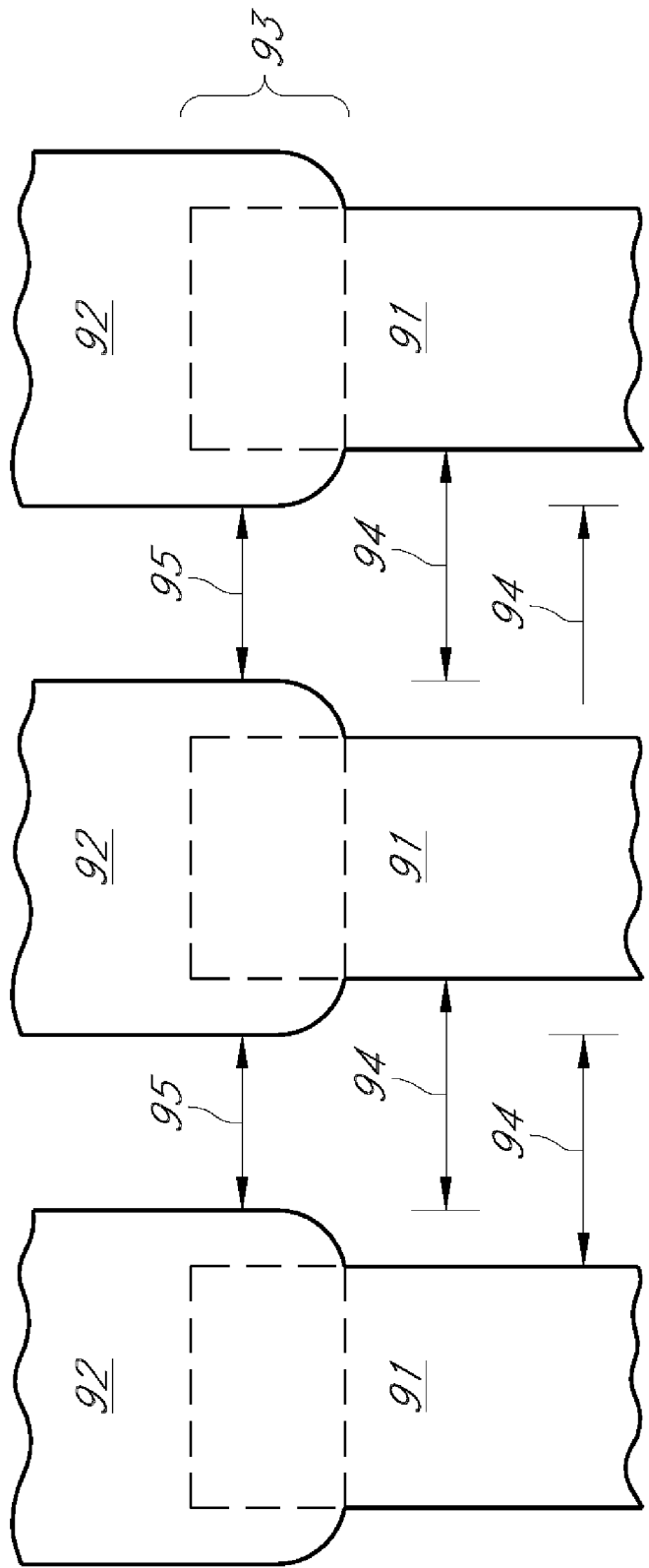
FIGS. 2A and 2B are schematic, top plan views of conductive lines in an integrated circuit.
Figure 2B:
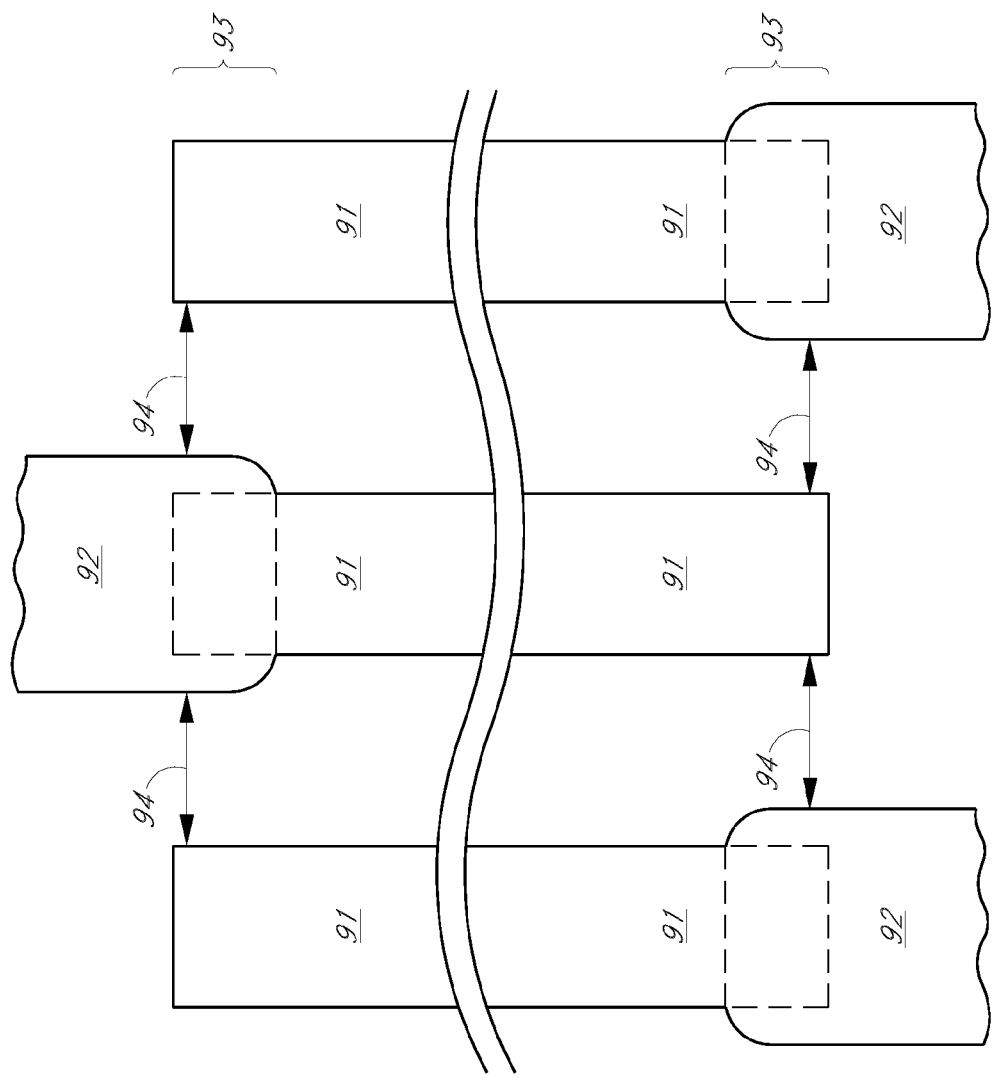

Typically, separately defined features contacting lines are nominally centered perfectly on the lines to maximize the separation of the features from neighboring pitch-multiplied lines. FIGS. 2A and 2B shows such an idealized alignment of pitch multiplied lines 91 and non-pitch multiplied lines 92. FIG. 2A shows an arrangement in which every line 91 is contacted on the same side with a line 92 and FIG. 2B shows an arrangement in which lines 92 contact the lines 91 on alternating sides.

Various types of misalignments can occur in the overlap region 93 in which the lines 91 and 92 contact, however. For example, the lines 92 may all be misaligned in one direction. Because the lines 92 are wider than the space separating the lines 91, a single line 92 can short two lines 91 if the misalignment is severe. Another form of misalignment can occur when a line 92 is skewed in one direction, relative to other lines 92. This can also cause a short if neighboring lines 92 contact. In reality, all these forms of misalignments can occur concurrently. In addition, because the lines 91 are also formed with a certain margin of error in size and location, any misalignment of the lines 92 may be exacerbated by misalignments or deviations in size of the lines 91. Thus, to minimize the possibility of shorts or otherwise sub-optimal contacts, the tolerances for misalignments of the lines 92 and 91 are preferably large. For lines 92 and 94 each having a given width, the distances 94 between each line 92 and each line 91 and the distances 95 between neighboring lines 92 are preferably each maximized to maximize tolerances. More preferably, both of the distances 94 and 95 are maximized. It will be appreciated that the same principles apply when the features are contacts, contact pads or other features that are to be kept separate.

Reference will now be made to the Figures, wherein like numerals refer to like parts throughout. It will be appreciated that the Figures are not necessarily drawn to scale.

Figure 3A:
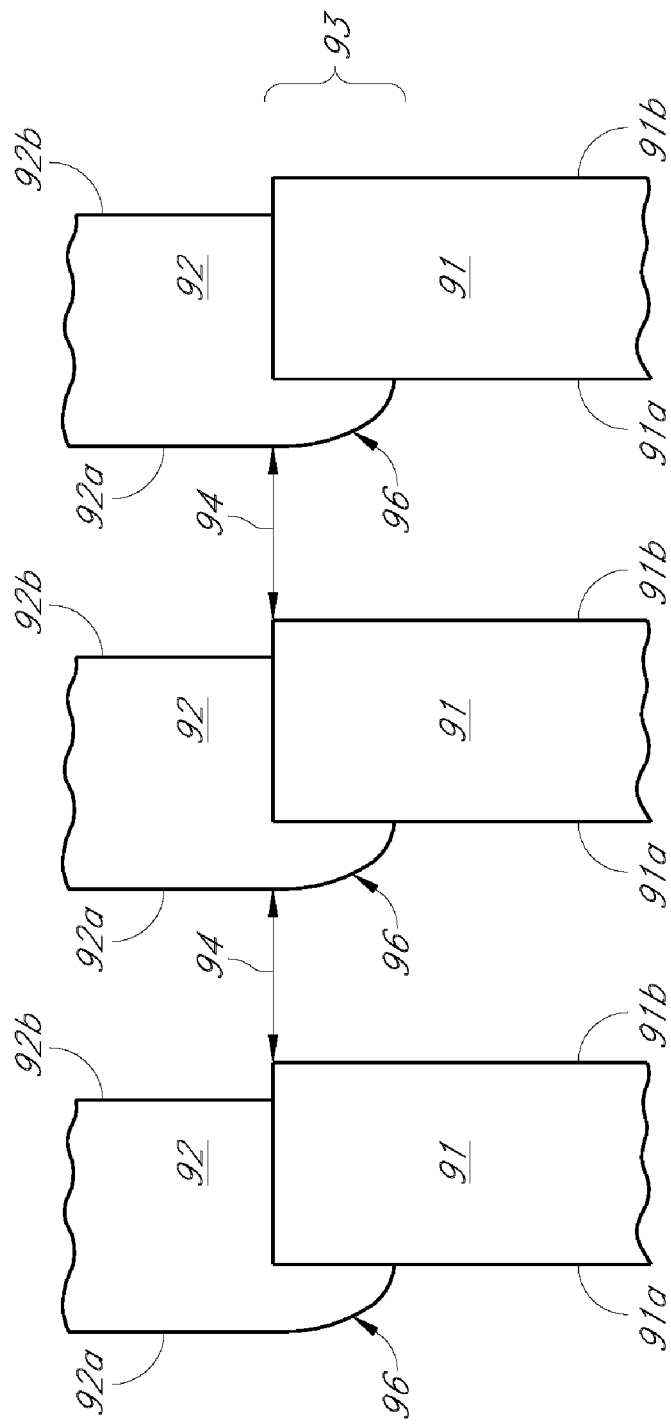
FIGS. 3A-3D are schematic, top plan views of a partially formed integrated circuit, in accordance with preferred embodiments of the invention.
Figure 3B:
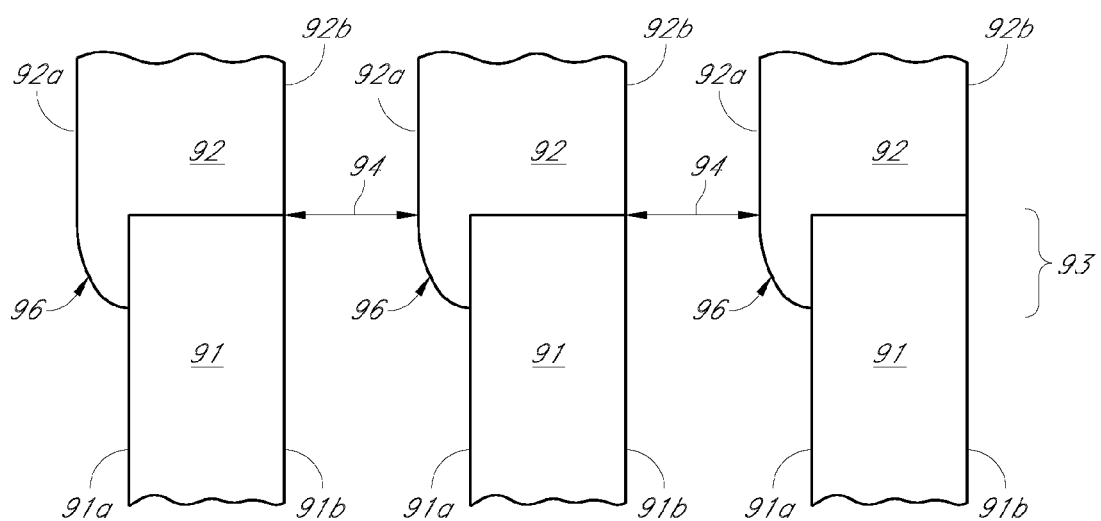
Figure 3C:
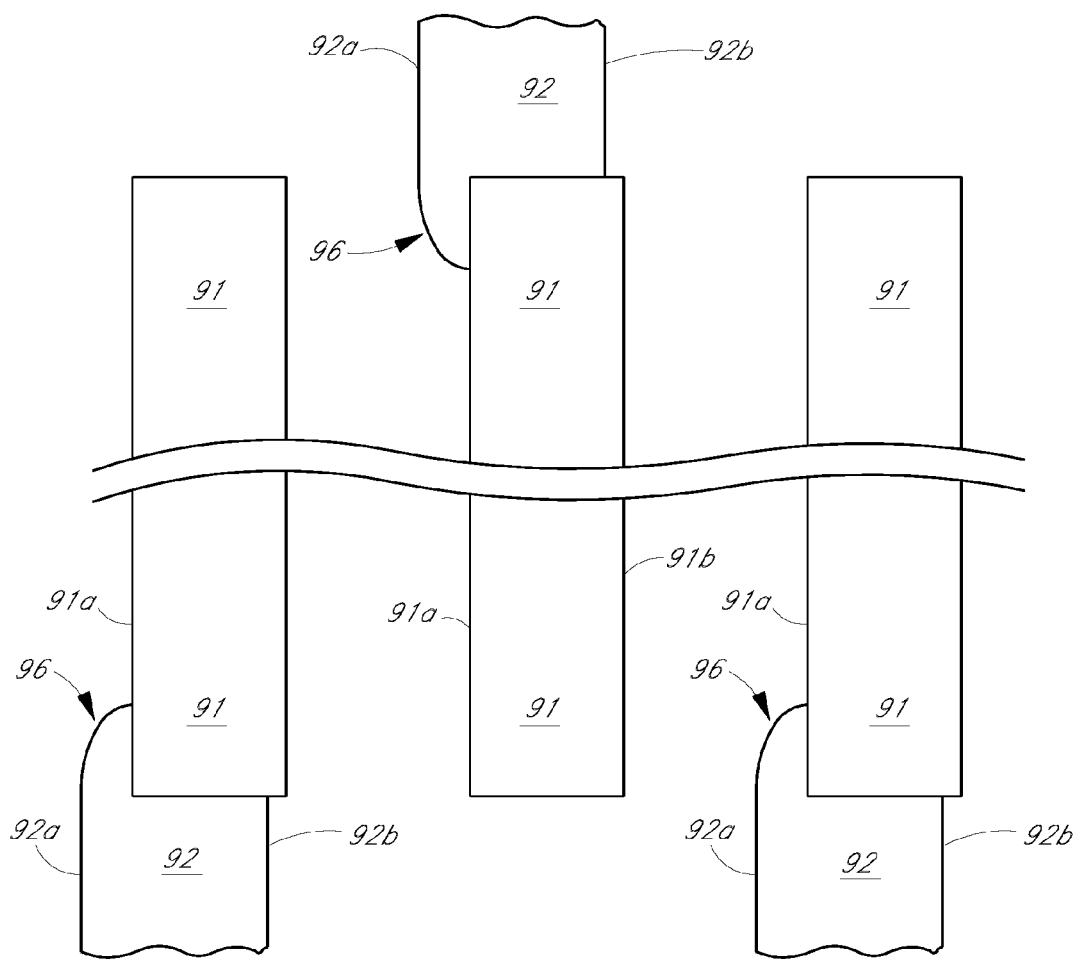
Figure 3D:
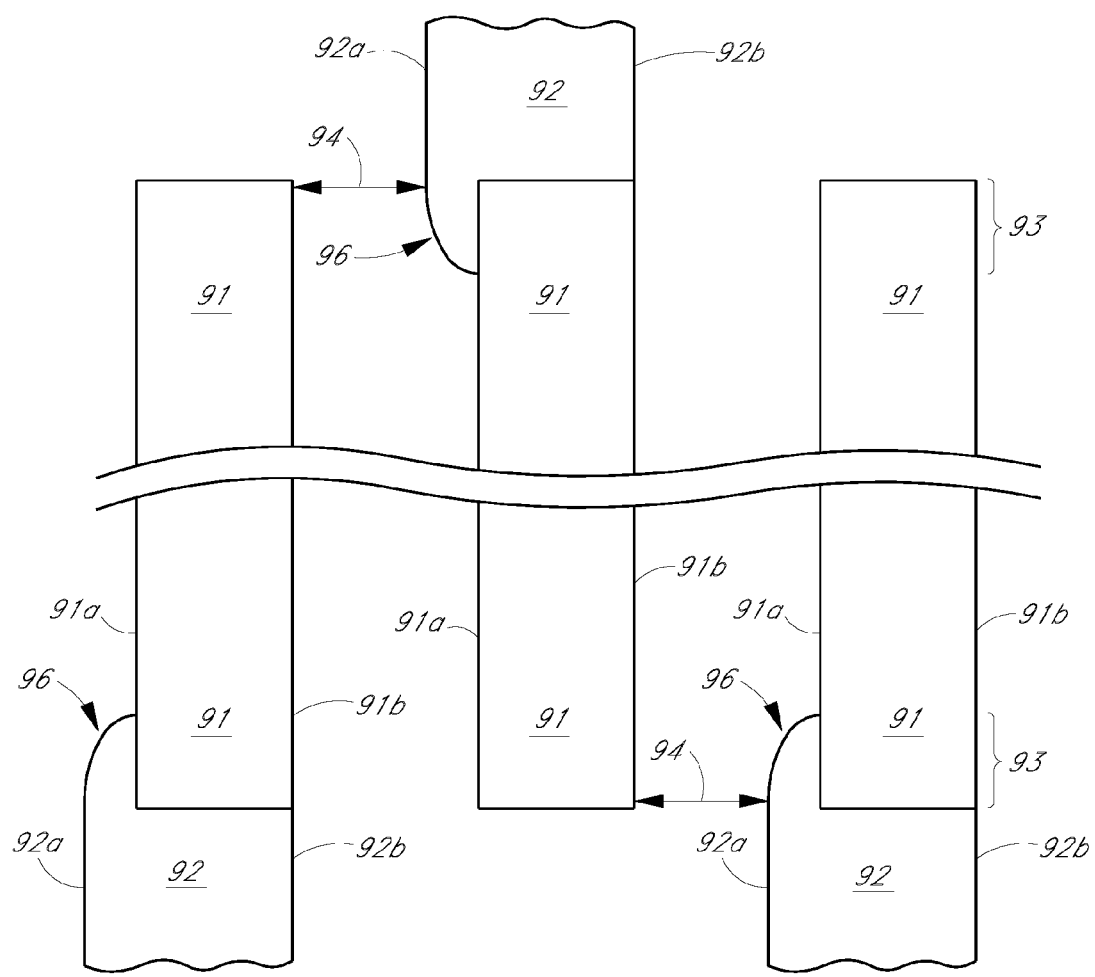

With reference initially to FIGS. 3A and 3B, preferred embodiments of the invention advantageously allow for increased misalignment tolerances. Preferably, a first feature, such as a line 91, is formed in a first mask layer and a second feature, such as a line 92, is overlaid the first feature by patterning a second masking layer. Rather than center the second feature on the first feature, the second feature is aligned so that only one of its sides 92a extends beyond a corresponding side 91a of the first feature, as illustrated in FIG. 3A. The other side 92b is shown inset from the corresponding side 91b of the first feature. Thus, only part of the end of the smaller first line 91 is overlapped with the end of the wider second line 92 and only one corner of the line 92 protrudes beyond a side of the line 91. In other preferred embodiments, as illustrated in FIG. 3B, side 92b preferably is positioned substantially flush or collinear with side 91b, while side 92a is positioned beyond side 91a. It will be appreciated that the lines 92 can also contact the lines 91 on alternating sides, as shown in FIGS. 3C and 3D. Moreover, because the lines 92 alternate on any given side of the lines 91, the corners 96 can protrude beyond either side 91a or 91b or some corners 96 can protrude beyond the side 91a and others beyond the side 91b, since concerns of two neighboring corners 96 shorting are minimized by the alternating arrangement.

Thus, preferably only one corner 96 of the wider second feature protrudes substantially beyond the narrow first feature. As discussed below, the protruding corner 96 can be formed rounded. By utilizing this rounding, the distance, e.g., distance 94, between neighboring features, e.g., the lines 91 and 92, in the overlap region, e.g., region 93, can be increased relative to lines 92 without rounding.

Figure 3E:
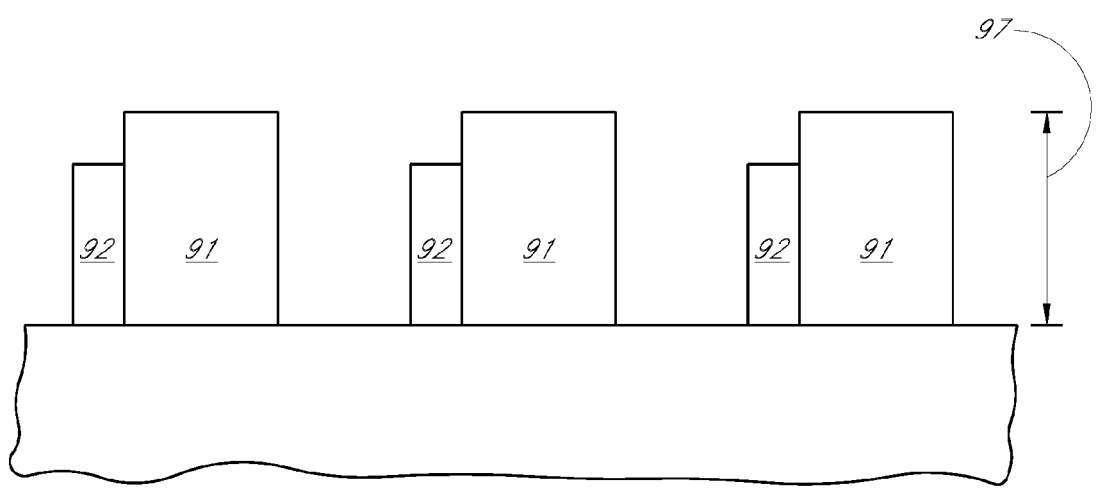
FIG. 3E is a schematic, cross-sectional side view the partially formed integrated circuit of FIGS. 3A, 3B, 3C or 3D, in accordance with preferred embodiments of the invention.

Moreover, as also discussed below, the second feature is preferably formed in photoresist by photolithography. The photoresist is preferably formed below the vertical height of the first feature, as illustrated in FIG. 3E for lines 91 and 92, the lines 91 having a height 97. As such, the first features, such as the lines 91, act as walls that permit the second features, such as the lines 92, to grow, if at all, in only one direction. Thus, by limiting the potential growth of the second features and by geometrically positioning the mask features to maximize the distance between neighboring features, misalignment tolerances can be increased.

Advantageously, any misalignments can be weighted in one direction, e.g., in the direction of the sides 91b, while still maintaining an adequate distance 94 between lines 92 and 91. Moreover, the photoresist can be overdeveloped to narrow the second features to further minimize the possibility of shorting. It will be appreciated that the overdevelopment can include any process which reduces the critical dimension of the lines 92. For example, the overdevelopment can include extending the development period and/or performing an additional treatment or technique to controllably remove resist, e.g., partially exposed resist. For example, the overdevelopment can remove resist in the exposure threshold or "gray" area between the area fully exposed to radiation transmitted through the reticle and lens system and the area that is "dark" or exposed to a light intensity below the exposure threshold for the resist.

While not limited by theory, three effects have been found to be advantageously present in the preferred embodiments. It will be appreciated that each of these effects are independently advantageous and are not each necessarily present in all embodiments. Nevertheless, all three effects can be found in particularly advantageous embodiments.

Preferably, the first mask features, such as the lines 91, are first formed and then the second mask features, such as the lines 92, are overlaid the first features. The second features are preferably patterned in photoresist that overlaps the first features. It will be appreciated that the photoresist is typically patterned by being exposed to radiation through a reticle and then developed. In the case of negative photoresist, radiation, e.g., light, is focused on parts of the photoresist which are to be retained, e.g., on the areas where the lines 92 are to be formed. Typically, the radiation activates a photosensitive compound, e.g., a photo-induced acid generator (PAG), which decreases the solubility of the photoresist, e.g., by causing it to polymerize. Such photoactivated chemicals, however, can diffuse, thereby causing the lines 92 to expand to areas that are not irradiated. In addition to decreasing the precision with which the lines 92 are formed, this diffusion can also cause the lines 92 to expand, thereby decreasing alignment tolerances by decreasing distances 94 between the lines 91 and 92.

In the preferred embodiments, the photoresist is preferably formed at a level below the top of the first mask features, such as the lines 91. The photoresist is then patterned to form the second features. Advantageously, in this arrangement, the first mask features act as a wall, only allowing diffusion of photogenerated acid from PAG's in a direction away from those first mask features. Thus, the misalignment tolerance in the region 93 can be increased by an amount approximately equal to the amount that the photogenerated acids would have otherwise diffused to expand the lines 92. Since diffusion can only occur in one direction, the risk of shorting from diffusion is effectively halved in the overlap region.

In addition, due to various factors, including diffusion of photogenerated acids and diffraction of radiation, photolithography will form corners that are rounded. Thus, by aligning features such as the lines 91 and 92 so that each narrow line 91 is closest to a rounded corner of a neighboring line 92, the rounding effect can be used to increase the distance between the wider lines 92 and adjacent narrower lines 91. This advantageously also increases misalignment margins by increasing corner-to-corner distances, such as the distance 94.

Also, while the preferred embodiments may be applied using any photodefinable material, including positive or negative photoresist, negative photoresist is utilized in particularly advantageous embodiments. Advantageously, by using negative photoresist to form the lines 92 and forming that photoresist below the level of the second features, such as the lines 91, the rounding effect can be increased. It will be appreciated that light reaching the photoresist between lines 91 is attenuated due to a shadowing affect caused by the presence of the taller lines 91. Moreover, this attenuation will increase with increasing distance down the lines 91 away from the ends of the lines 91. Advantageously, because the formation of the lines 92 depends upon light hitting the negative photoresist, the attenuation further rounds off and narrows the width of the lines 92 between lines 91. As a result, the distances between the wider lines 92 and the neighboring narrower lines 91 can be further increased, thereby further increasing misalignment margins.

More preferably, a combination of positive and negative photoresist is used, with the positive photoresist used in forming (preferably via a process utilizing spacers) the lines 91 and the negative photoresist using in forming the lines 92. The negative photoresist advantageously increases the rounding discussed above, while the positive photoresist advantageously allows a higher resolution relative to the negative photoresist.

Figure 4A:
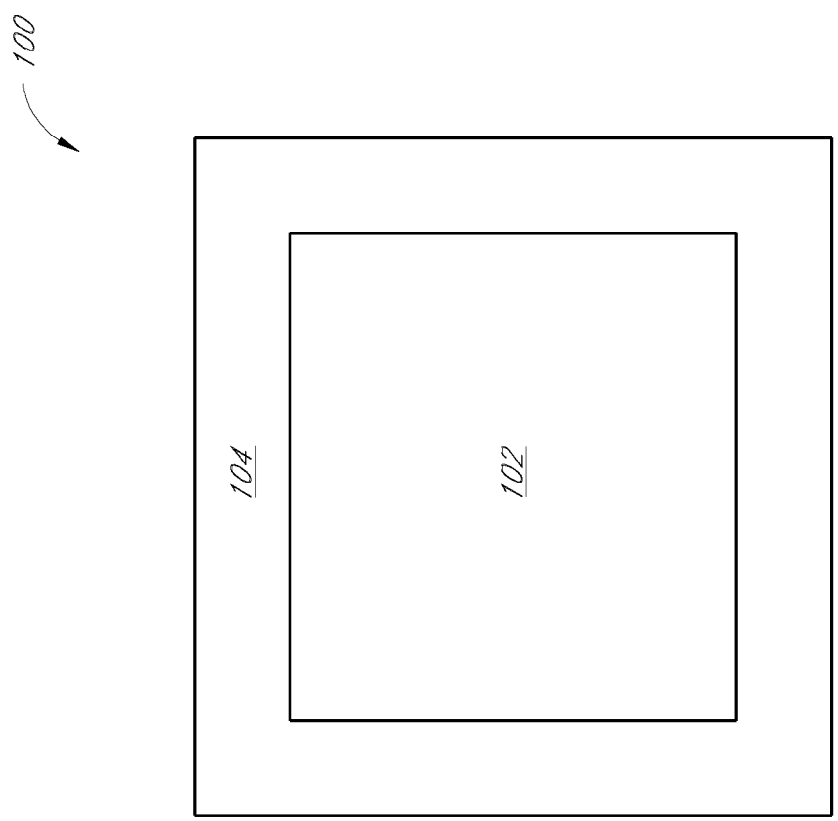
FIGS. 4A-4B are schematic, top plan and cross-sectional side views, respectively, of a partially formed integrated circuit, in accordance with preferred embodiments of the invention.

FIG. 4A shows a top view of an integrated circuit 100, which is preferably a memory chip. A central region 102, the "array," is surrounded by a peripheral region 104, the "periphery." It will be appreciated that, in a fully formed integrated circuit 100, the array 102 will typically be densely populated with conducting lines and electrical devices such as transistors and capacitors. In a memory device, the electrical devices form a plurality of memory cells, which are typically arranged in a regular pattern, such as rows. Desirably, pitch multiplication can be used to form features such as rows/columns of transistors, capacitors or interconnects in the array 102, as discussed below. On the other hand, the periphery 104 typically comprises features larger than those in the array 102. Conventional photolithography, rather than pitch multiplication, is preferably used to pattern features, such as logic circuitry, in the periphery 104, because the geometric complexity of logic circuits located in the periphery 104 makes using pitch multiplication difficult, whereas the regular grid typical of memory array patterns is conducive to pitch multiplication. In addition, some devices in the periphery require larger geometries due to electrical constraints, thereby making pitch multiplication less advantageous than conventional photolithography for such devices. It will be appreciated that the periphery 104 and the array 102 are not draw to scale and their relative positions may vary from that depicted.

Figure 4B:
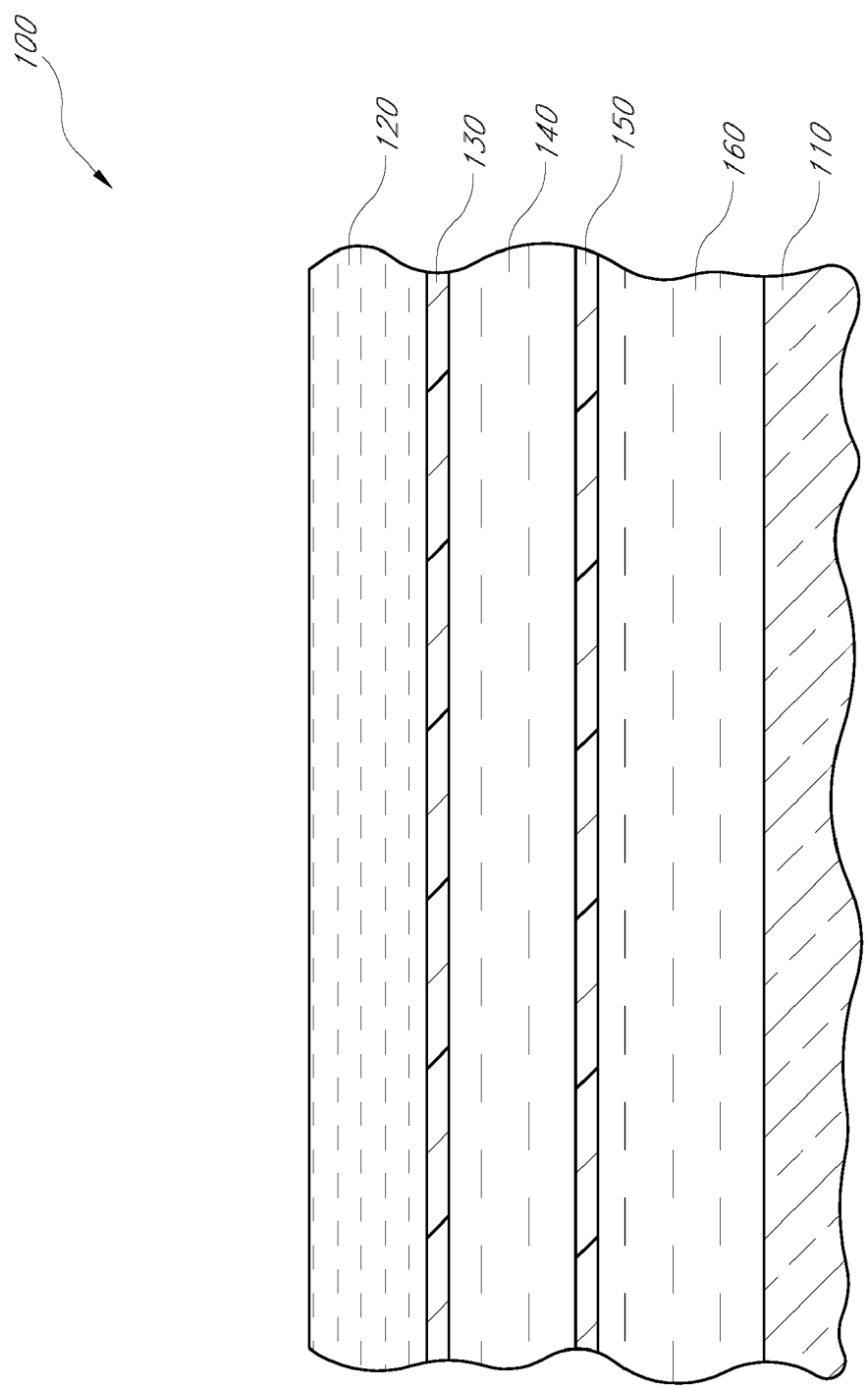

With reference to FIG. 4B, a partially formed integrated circuit 100 is provided. A substrate 110 is provided below various masking layers 120-160. The layers 120-160 will be etched to form a mask for patterning the substrate 110 to form various features, as discussed below.

The materials for the layers 120-160 overlying the substrate 110 are preferably chosen based upon consideration of the chemistry and process conditions for the various pattern forming and pattern transferring steps discussed herein. Because the layers between a topmost selectively definable layer 120, which preferably is definable by a lithographic process, and the substrate 110 will preferably function to transfer a pattern derived from the selectively definable layer 120 to the substrate 110, the layers between the selectively definable layer 120 and the substrate 110 are preferably chosen so that they can be selectively etched relative to other exposed materials. It will be appreciated that a material is considered selectively, or preferentially, etched when the etch rate for that material is at least about 5 times greater, preferably about 10 times greater and, most preferably, at least about 40 times greater than that for surrounding materials.

In the illustrated embodiment, the selectively definable layer 120 overlies a first hard mask, or etch stop, layer 130, which overlies a temporary layer 140, which overlies a second hard mask, or etch stop, layer 150, which overlies an additional mask layer 160, which overlies the substrate 110 to be processed (e.g., etched) through a mask. Preferably, the mask through which the substrate 110 is processed is formed in the second hard mask layer 150 or in the additional mask layer 160.

It will be understood that in common methods of transferring patterns, both the mask and the underlying substrate are exposed to an etchant, which preferentially etches away the substrate material. The etchants, however, also wear away the mask materials, albeit at a slower rate. Thus, over the course of transferring a pattern, the mask can be worn away by the etchant before the pattern transfer is complete. These difficulties are exacerbated where the substrate 110 comprises multiple different materials to be etched. In such cases, the additional mask layer 160, which preferably comprises a thick layer of amorphous carbon, is desirable to prevent the mask pattern from being worn away before the pattern transfer is complete. The illustrated embodiment shows the use of the additional mask layer 160.

It will also be understood, however, that because the various layers are chosen based upon the requirements of chemistry and process conditions, one or more of the layers can be omitted in some embodiments. For example, the additional mask layer 160 can be omitted in embodiments where the substrate 110 is relatively simple, e.g., where the substrate 110 is a single layer of material and where the depth of the etch is moderate. In such cases, the second hard mask layer 150 may be a sufficient mask for transferring a pattern to the substrate 110. Similarly, for a particularly simple substrate 110, the various other layers, such the second hard mask layer 150 itself, may be omitted and overlying mask layers may be sufficient for the desired pattern transfer. The illustrated sequence of layers, however, is particularly advantageous for transferring patterns to difficult to etch substrates, such as a substrate 110 comprising multiple materials or multiple layers of materials, or for forming small and high aspect ratio features.

With reference to FIG. 2, the selectively definable layer 120 is preferably formed of a photoresist, including any photoresist known in the art. For example, the photoresist can be any photoresist compatible with 13.7 nm, 157 nm, 193 nm, 248 nm or 365 nm wavelength systems, 193 nm wavelength immersion systems or electron beam lithographic systems. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the first hard mask layer 130 preferably comprises an inorganic material, and exemplary materials include silicon oxide ($SiO_2$), silicon or a dielectric anti-reflective coating (DARC), such as a silicon-rich silicon oxynitride. In the illustrated embodiment, the first hard mask layer 130 is a dielectric anti-reflective coating (DARC). The temporary layer 140 is preferably formed of amorphous carbon, which offers very high etch selectivity relative to the preferred hard mask materials. More preferably, the amorphous carbon is a form of transparent carbon that is highly transparent to light and which offers further improvements for photo alignment by being transparent to wavelengths of light used for such alignment. Deposition techniques for forming a highly transparent carbon can be found in A. Helmbold, D. Meissner, Thin Solid Films, 283 (1996) 196-203, the entire disclosure of which is incorporated herein by reference.

Advantageously, using DARCs for the first hard mask layer 130 can be particularly advantageous for forming patterns having pitches near the resolution limits of a photolithographic technique. The DARCs can enhance resolution by minimizing light reflections, thus increasing the precision with which photolithography can define the edges of a pattern. Optionally, a bottom anti-reflective coating (BARC) (not shown) can similarly be used in addition to the first hard mask layer 130 to control light reflections.

The second hard mask layer 150 preferably comprises a dielectric anti-reflective coating (DARC) (e.g., a silicon oxynitride), silicon or aluminum oxide ($Al_2O_3$). A bottom anti-reflective coating (BARC) (not shown) can optionally be used to control light reflections. In addition, like the temporary layer 140, the additional mask layer 160 is preferably formed of amorphous carbon due to its excellent etch selectivity relative to many materials.

In addition to selecting appropriate materials for the various layers, the thicknesses of the layers 120-160 are preferably chosen depending upon compatibility with the etch chemistries and process conditions described herein. For example, when transferring a pattern from an overlying layer to an underlying layer by selectively etching the underlying layer, materials from both layers are removed to some degree. Thus, the upper layer is preferably thick enough so that it is not worn away over the course of the pattern transfer.

In the illustrated embodiment, the selectively definable layer 120 is a photodefinable layer preferably between about 50-300 nm thick and, more preferably, between about 200-250 nm thick. The first hard mask layer 130 is preferably between about 100-400 nm thick and, more preferably, between about 150-300 nm thick. The temporary layer 140 is preferably between about 100-200 nm thick and, more preferably, between about 120-150 nm thick. The second hard mask layer 150 is preferably between about 20-80 nm thick and, more preferably, about 50 nm thick and the additional mask layer 160 is preferably between about 200-500 nm thick and, more preferably, about 300 nm thick.

The various layers discussed herein can be formed by various methods known to those of skill in the art. For example, various vapor deposition processes, such as chemical vapor deposition, can be used to form hard mask layers. Preferably, a low temperature chemical vapor deposition process is used to deposit the hard mask layers or any other materials, e.g., spacer material, over the mask layer 160, where the mask layer 160 is formed of amorphous silicon. Such low temperature deposition processes advantageously prevent chemical or physical disruption of the amorphous carbon layer. Spin-on-coating processes can be used to form photodefinable layers. In addition, amorphous carbon layers can be formed by chemical vapor deposition using a hydrocarbon compound, or mixtures of such compounds, as carbon precursors. Exemplary precursors include propylene, propyne, propane, butane, butylene, butadiene and acetelyne. A suitable method for forming amorphous carbon layers is described in U.S. Pat. No. 6,573,030 B1, issued to Fairbairn et al. on Jun. 3, 2003, the entire disclosure of which is incorporated herein by reference. In addition, the amorphous carbon may be doped. A suitable method for forming doped amorphous carbon is described in U.S. patent application Ser. No. 10/652,174 to Yin et al., the entire disclosure of which is incorporated herein by reference.

In a first phase of methods in accordance with the preferred embodiments and with reference to FIGS. 4-11, a pattern of spacers is formed by pitch multiplication.

Figure 5:
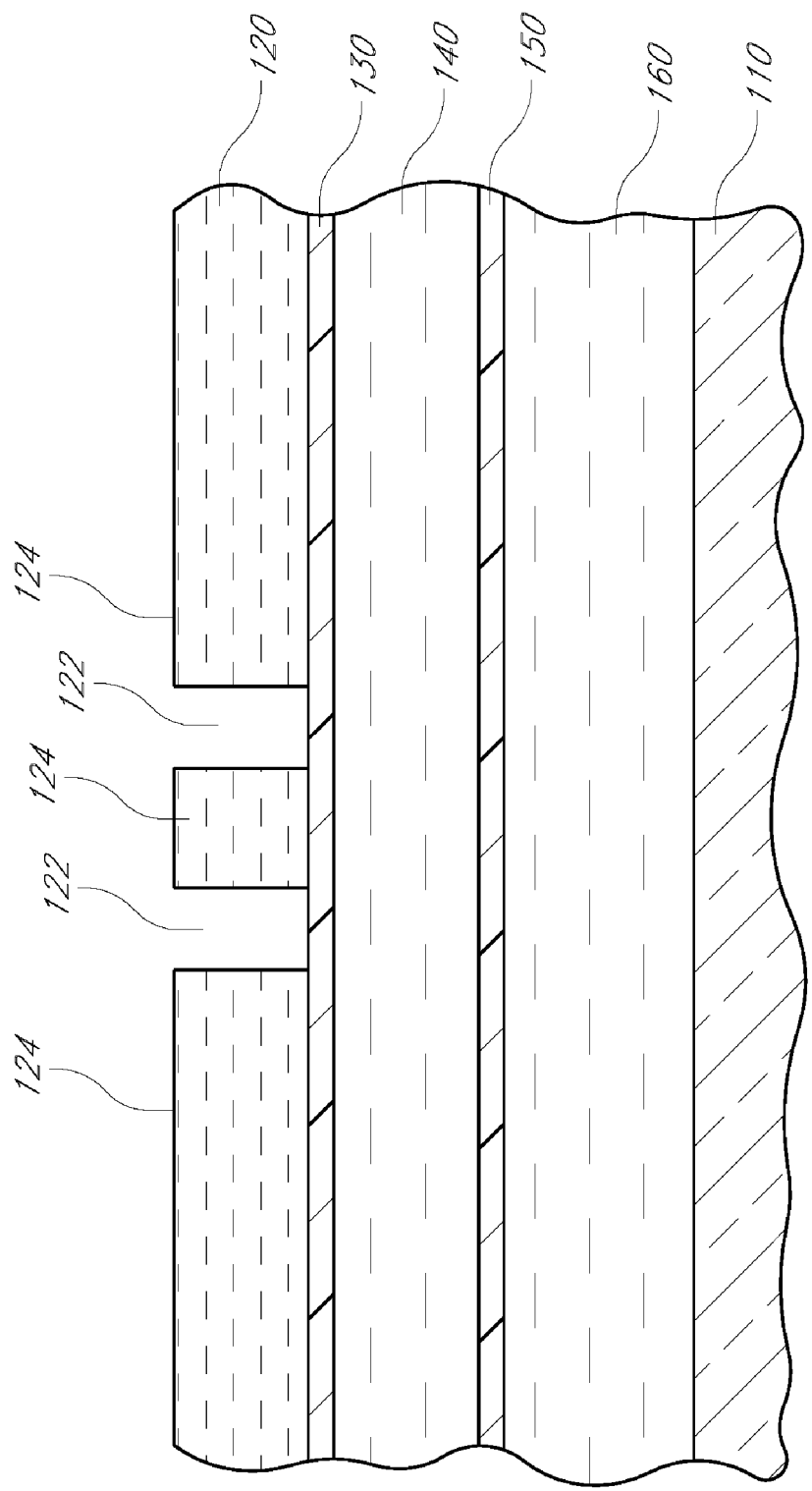
FIG. 5 is a schematic, cross-sectional side view of the partially formed memory device of FIGS. 4A-4B after forming lines in a selectively definable layer, in accordance with preferred embodiments of the invention

With reference to FIG. 5, a pattern comprising spaces or trenches 122 delimited by photodefinable material features 124 is formed in the photodefinable layer 120. The trenches 122 can be formed by, e.g., photolithography, in which the layer 120 is exposed to radiation through a reticle and then developed. After being developed, the remaining photodefinable material, photoresist in the illustrated embodiment, forms mask features such as the illustrated lines 124 (shown in cross-section only).

The pitch of the resulting lines 124 is equal to the sum of the width of a line 124 and the width of a neighboring space 122. To minimize the critical dimensions of features formed using this pattern of lines 124 and spaces 122, the pitch is preferably at or near the limits of the photolithographic technique used to pattern the photodefinable layer 120. For example, for photolithography utilizing 248 nm light, the pitch of the lines 124 can be about 100 nm. Thus, the pitch may be at the minimum pitch of the photolithographic technique and the spacer pattern discussed below can advantageously have a pitch below the minimum pitch of the photolithographic technique.

Figure 6:
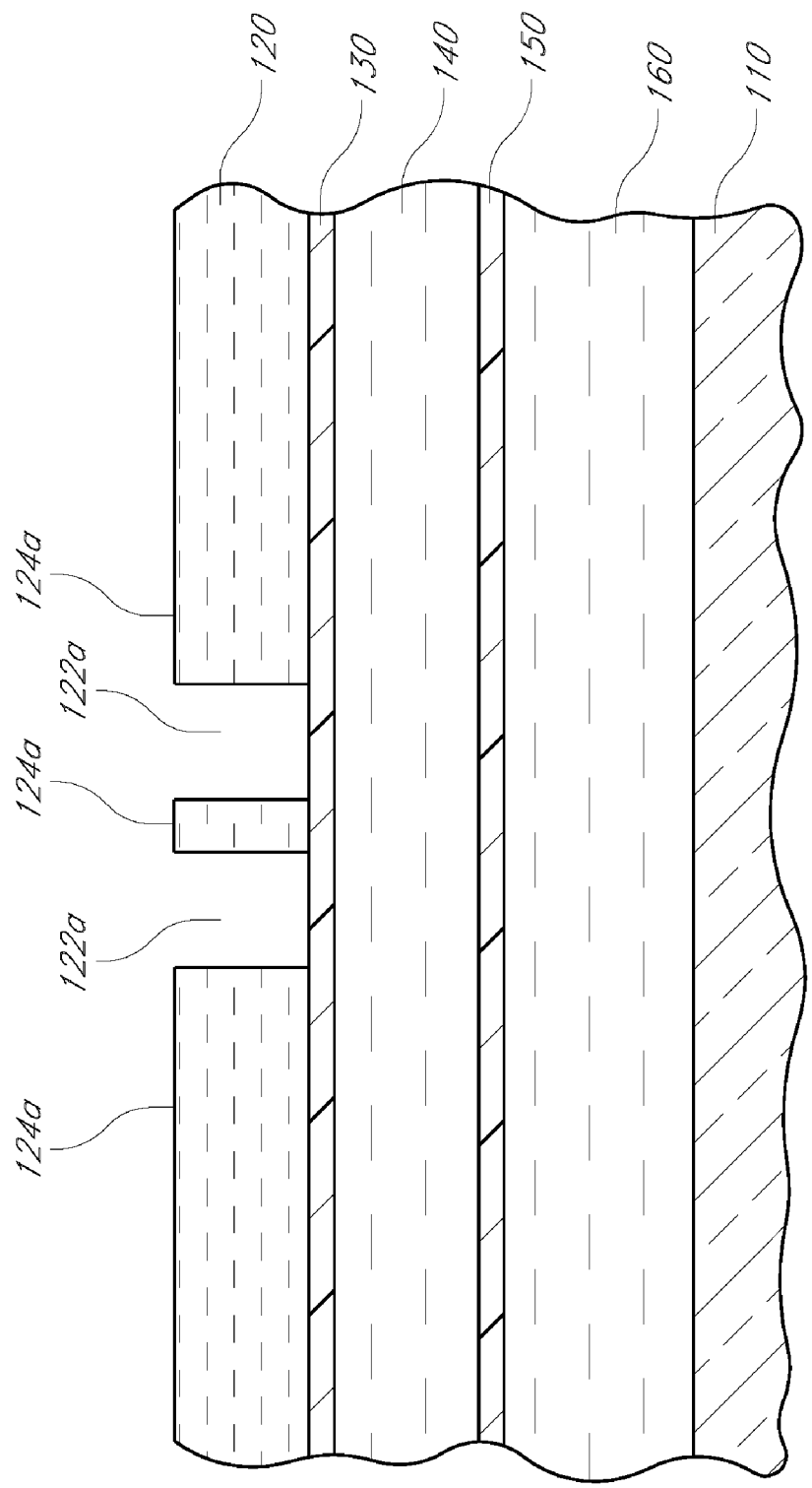
FIG. 6 is a schematic, cross-sectional side view of the partially formed integrated circuit of FIG. 5 after widening spaces between photoresist lines, in accordance with preferred embodiments of the invention.

As shown in FIG. 6, the spaces 122 can optionally be widened or narrowed to a desired dimension. For example, the spacers 122 can be widened by etching the photoresist lines 124, to form modified spaces 122a and lines 124a. The photoresist lines 124 are preferably etched using an isotropic etch, such as a sulfur oxide plasma, e.g., a plasma comprising $SO_2$, $O_2$, $N_2$ and Ar. The extent of the etch is preferably selected so that the widths of the lines 124a are substantially equal to the desired spacing between the later-formed spacers 175, as will be appreciated from the discussion of FIGS. 9-11 below. Advantageously, this etch allows the lines 124a to be narrower than would otherwise be possible using the photolithographic technique used to pattern the photodefinable layer 120. In addition, the etch can smooth the edges of the lines 124a, thus improving the uniformity of those lines. In other embodiments, the spaces between the spaces 122 can be narrowed by expanding the lines 124 to a desired size. For example, additional material can be deposited over the lines 124 or the lines 124 can be chemically reacted to form a material having a larger volume to increase their size.

Figure 9:
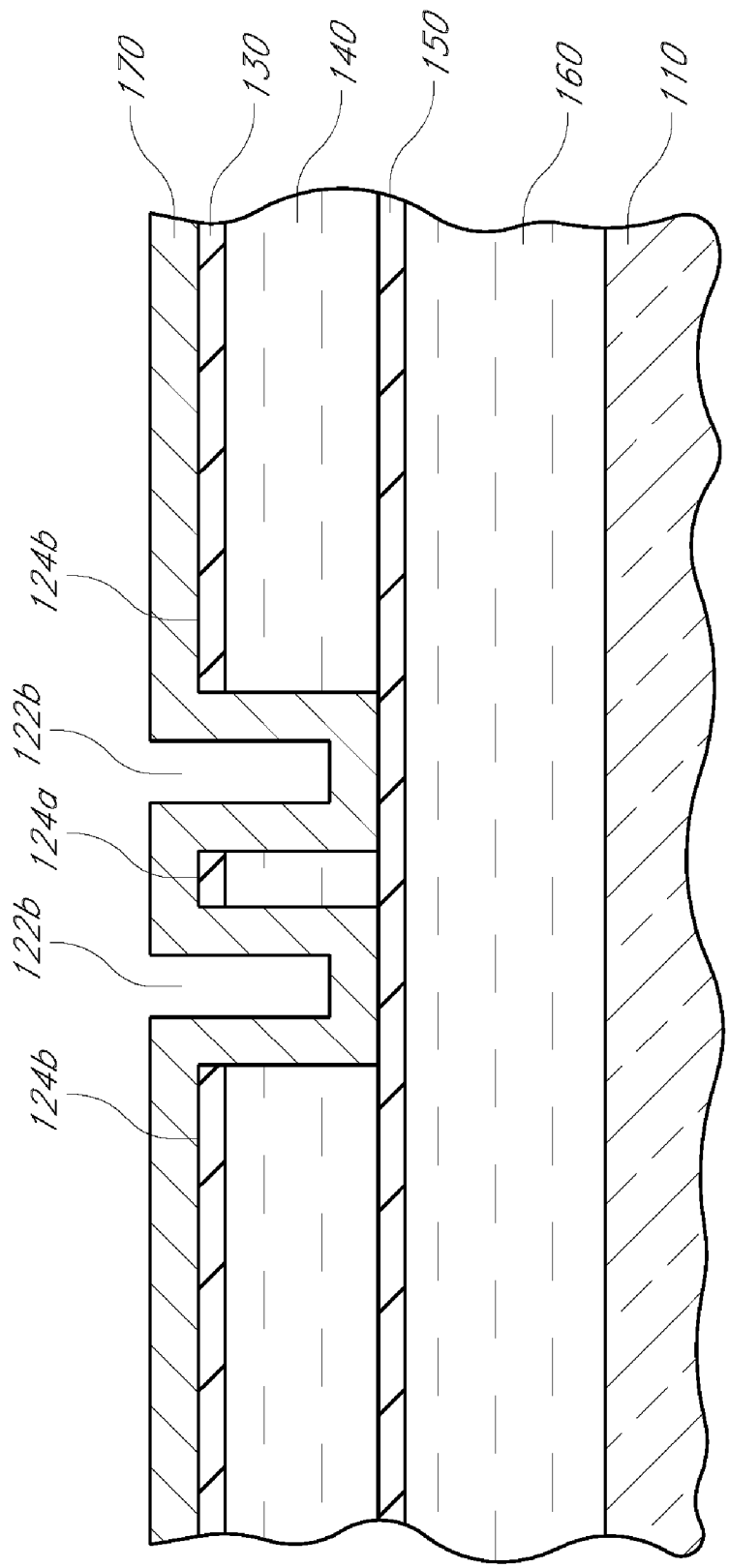
FIG. 9 is a schematic, cross-sectional side view of the partially formed integrated circuit of FIG. 8 after depositing a blanket layer of a spacer material, in accordance with preferred embodiments of the invention.

The pattern in the (modified) photodefinable layer 120 is preferably transferred to the temporary layer 140 to allow for deposition of a layer 170 of spacer material (FIG. 9). The temporary layer 140 is preferably formed of a material that can withstand the process conditions for spacer material deposition and etch, discussed below. In other embodiments where the deposition of spacer material is compatible with the photodefinable layer 120, the temporary layer 140 can be omitted and the spacer material can be deposited directly on the photo-defined features 124 or the modified photodefined features 124a of the photodefinable layer 120 itself.

In the illustrated embodiment, in addition to having higher heat resistance than photoresist, the material forming the temporary layer 140 is preferably selected such that it can be selectively removed relative to the material for the spacers 175 (FIG. 10) and the underlying etch stop layer 150. As noted above, the layer 140 is preferably formed of amorphous carbon.

Figure 7:
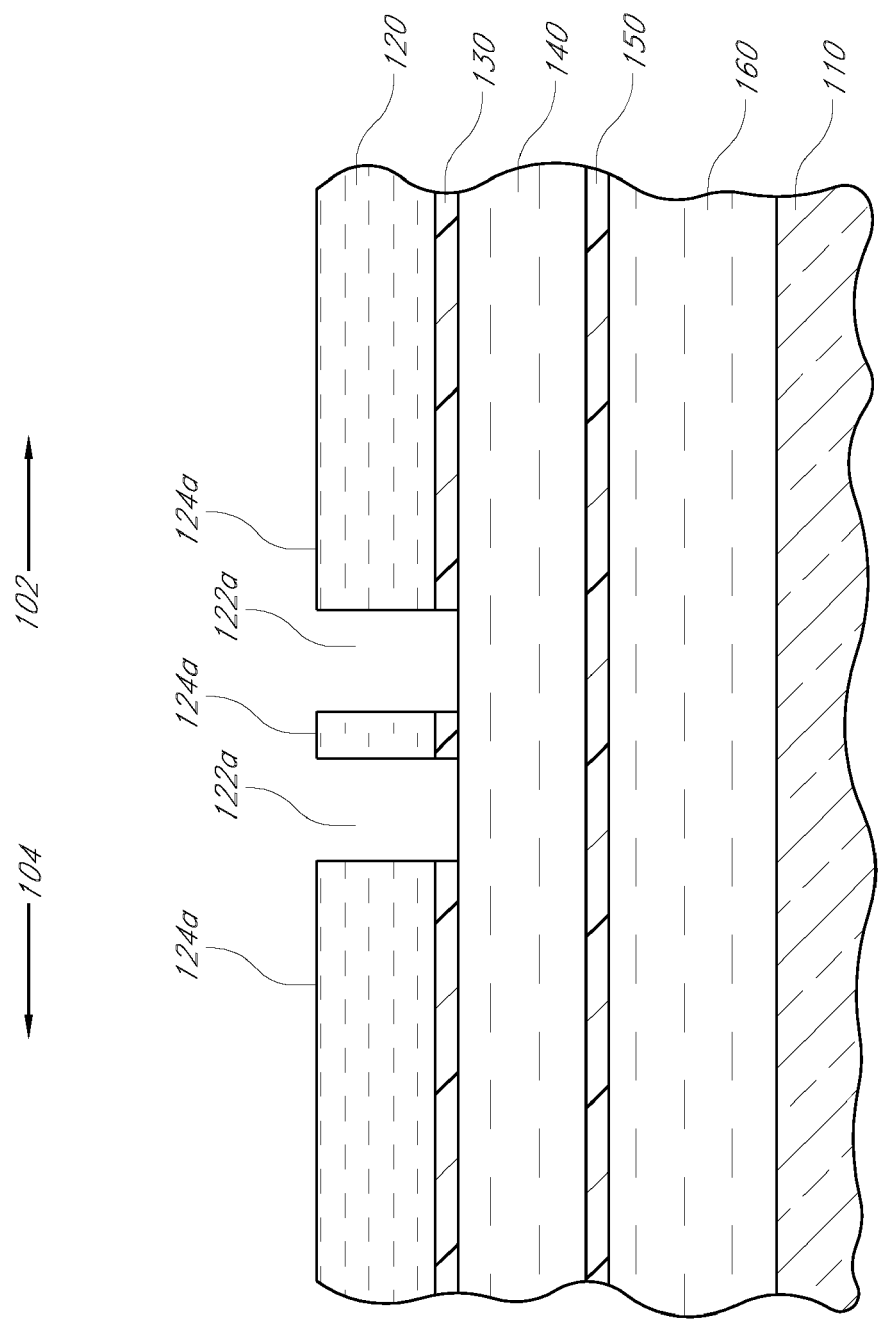
FIG. 7 is a schematic, cross-sectional side view of the partially formed integrated circuit of FIG. 6 after etching through a hard mask layer, in accordance with preferred embodiments of the invention.

The pattern in the photodefinable layer 120 is preferably first transferred to the hard mask layer 130, as shown in FIG. 7. This transfer is preferably accomplished using an anisotropic etch, such as an etch using a fluorocarbon plasma, although a wet (isotropic) etch may also be suitable if the hard mask layer 130 is thin. Preferred fluorocarbon plasma etch chemistries include $CF_4$, $CFH_3$, $CF_2H_2$ and $CF_3H$.

Figure 8:
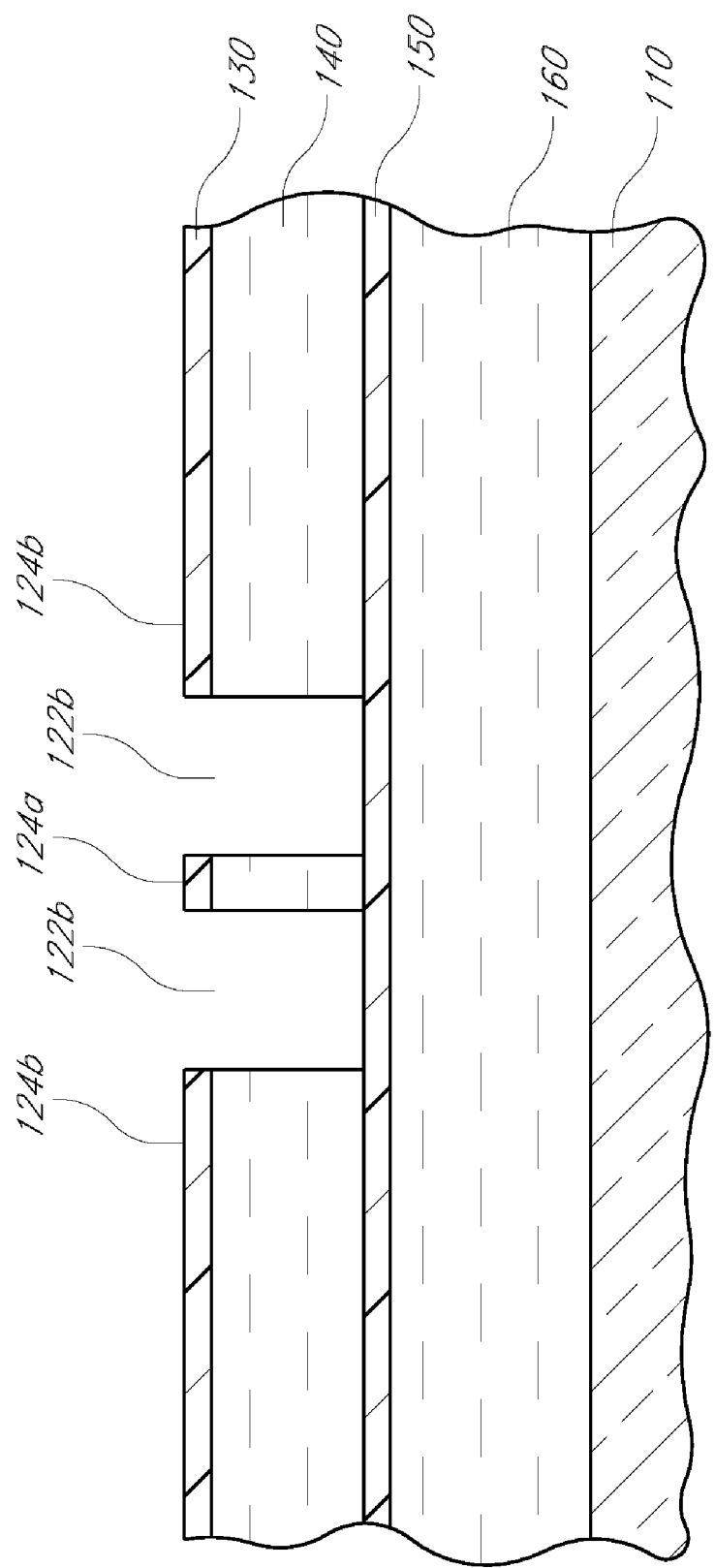
FIG. 8 is a schematic, cross-sectional side view of the partially formed integrated circuit of FIG. 7 after transferring a pattern from the photoresist and hard mask layers to a temporary layer, in accordance with preferred embodiments of the invention.

The pattern in the photodefinable layer 120 is then transferred to the temporary layer 140, as shown in FIG. 8, preferably using a $SO_2$-containing plasma, e.g., a plasma containing $SO_2$, $O_2$ and Ar. Advantageously, the $SO_2$-containing plasma can etch carbon of the preferred temporary layer 140 at a rate greater than 20 times and, more preferably, greater than 40 times the rate that the hard mask layer 130 is etched. A suitable $SO_2$-containing plasma is described in U.S. patent application Ser. No. 10/931,772 to Abatchev et al., filed Aug. 31, 2004, entitled Critical Dimension Control, the entire disclosure of which is incorporate herein by reference. It will be appreciated that the $SO_2$-containing plasma can simultaneously etch the temporary layer 140 and also remove the photodefinable layer 120. The resulting lines 124b constitute the placeholders or mandrels along which a pattern of spacers 175 (FIG. 10) will be formed.

Next, as shown in FIG. 9, a layer 170 of spacer material is preferably blanket deposited conformally over exposed surfaces, including the hard mask layer 130, the hard mask 150 and the sidewalls of the temporary layer 140. Optionally, the hard mask layer 130 can be removed before depositing the layer 170. The spacer material can be any material that can act as a mask for transferring a pattern to the underlying substrate 110, or that otherwise can allow processing of underlying structures through the mask being formed. The spacer material preferably: 1) can be deposited with good step coverage; 2) can be deposited at a temperature compatible with the temporary layer 140; 3) can be selectively etched relative to the temporary layer 140 and any layer underlying the temporary layer 140. Preferred materials include silicon oxides and nitrides. The spacer material is preferably deposited by chemical vapor deposition or atomic layer deposition. The layer 170 is preferably deposited to a thickness of between about 20-60 nm and, more preferably, about 20-50 nm. Preferably, the step coverage is about 80% or greater and, more preferably, about 90% or greater.

Figure 10:
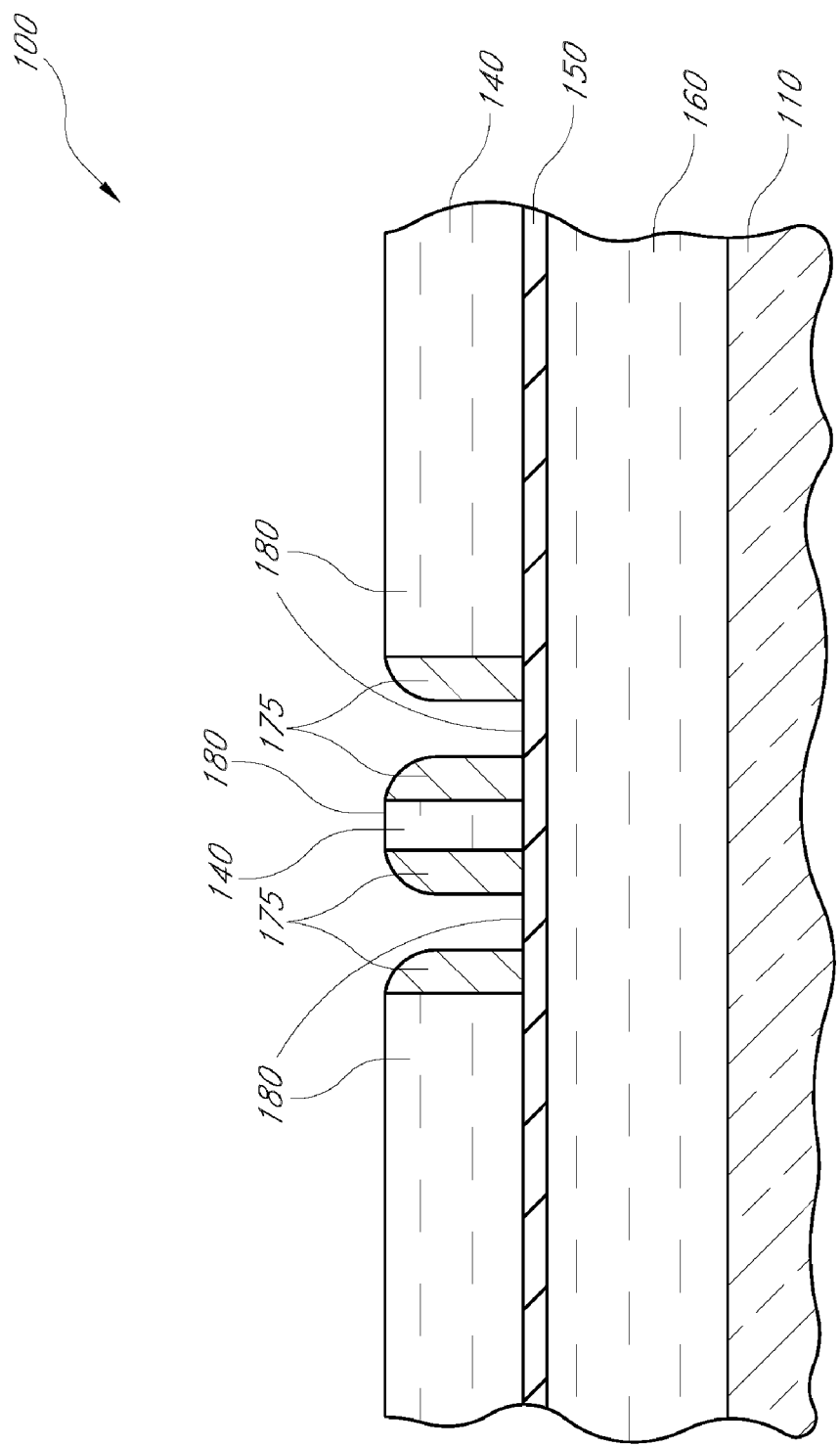
FIG. 10 is a schematic, cross-sectional side view of the partially formed integrated circuit of FIG. 9 after a spacer etch, in accordance with preferred embodiments of the invention.

As shown in FIG. 10, the spacer layer 170 is then subjected to an anisotropic etch to remove spacer material from horizontal surfaces 180 of the partially formed integrated circuit 100. Such an etch, also known as a spacer etch, can be performed using HBr/Cl plasma. The etch includes a physical component and preferably can also include a chemical component and can be, e.g., a reactive ion etch (RIE), such as a $Cl_2$, HBr etch. Such an etch can be performed, for example, using a LAM TCP9400 flowing about 0-50 sccm $Cl_2$ and about 0-200 sccm HBr at about 7-60 mTorr pressure with about 300-1000 W top power and about 50-250 W bottom power.

Figure 11:
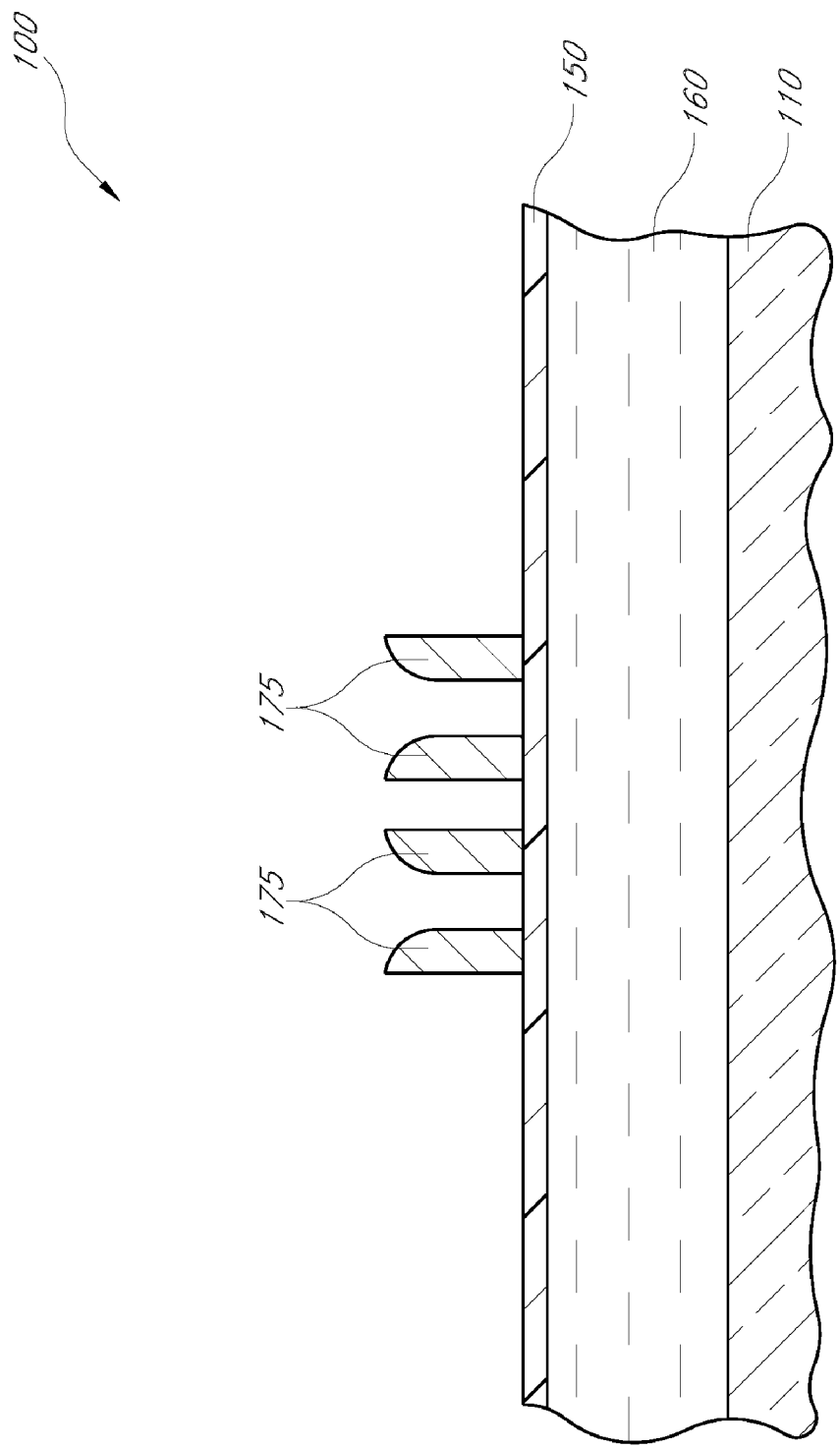
FIG. 11 is a schematic, cross-sectional side view of the partially formed integrated circuit of FIG. 10 after removing remnants of the temporary layer from between spacers, in accordance with preferred embodiments of the invention.

With reference to FIG. 11, the hard mask layer 130 (if still present) and the temporary layer 140 are next removed to leave freestanding spacers 175. The temporary layer 140 is selectively removed, preferably using a sulfur-containing plasma etch such as an etch using $SO_2$.

Thus, pitch multiplication has been accomplished. In the illustrated embodiment, the pitch of the spacers 175 is roughly half that of the photoresist lines 124 and spaces 122 (FIG. 5) originally formed by photolithography. Advantageously, spacers 175 having a pitch of about 100 nm or less can be formed. It will be appreciated that because the spacers 175 are formed on the sidewalls of the features or lines 124b, the spacers 175 generally follow the outline of the pattern of features or lines 124a in the photodefinable layer 120 and, so, typically form a closed loop.

Next, in a second phase of methods according to the preferred embodiments, the loops formed by the spacers 175 are separated into individual lines. This separation is preferably accomplished by an etch that for each loop forms two separate lines of spacers 175 corresponding to two separate conductive paths in the substrate 110. It will be appreciated that more than two lines can be formed, if desired, by etching the spacers 175 at more than two locations.

To form the separate lines, a protective mask is preferably formed over parts of the lines to be retained and the exposed, unprotected parts of the spacer loops are then etched. The protective mask is then removed to leave a plurality of electrically separated lines.

Figure 12:
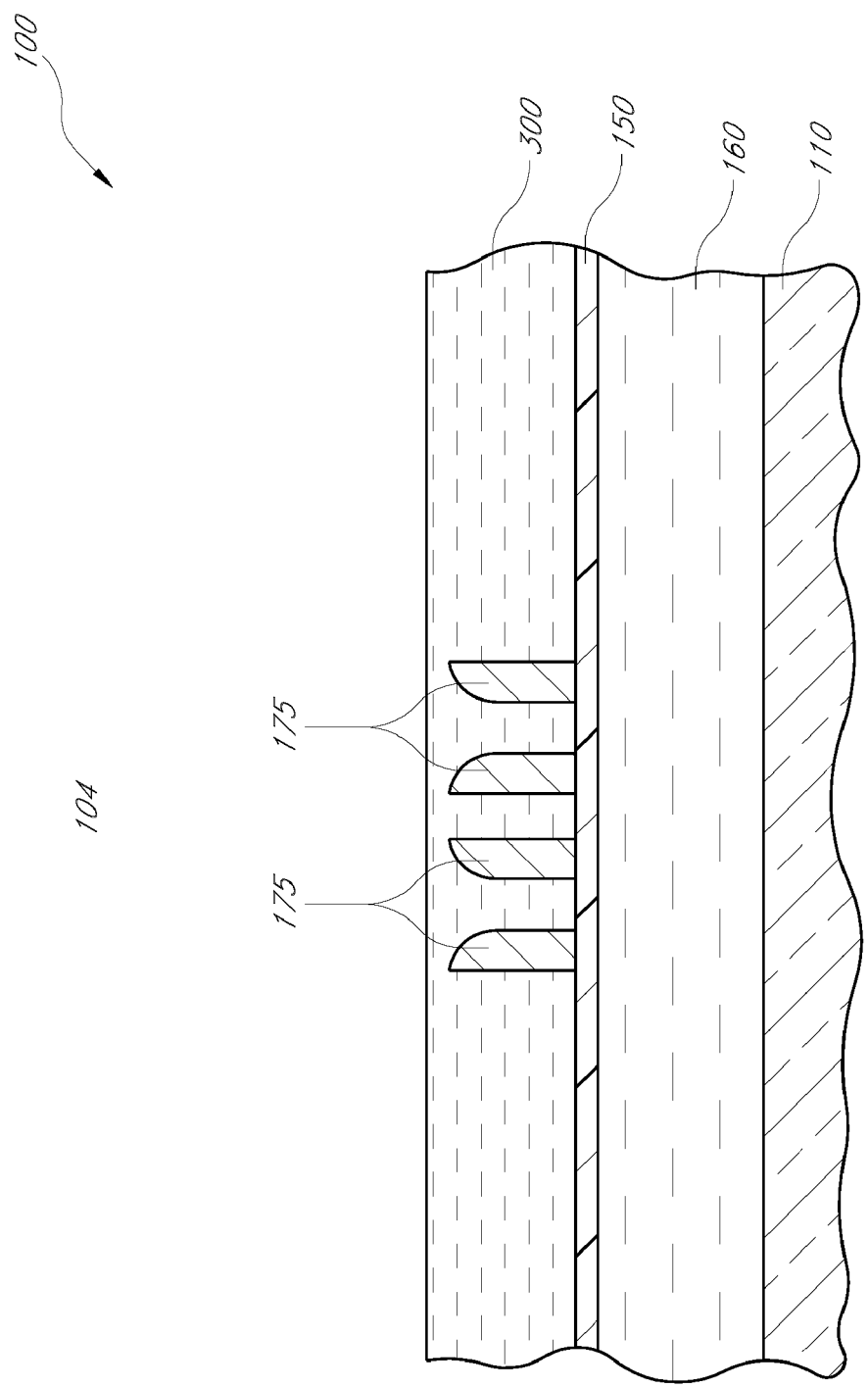
FIG. 12 is a schematic, cross-sectional side view of the partially formed integrated circuit of FIG. 11 after depositing a protective layer, in accordance with preferred embodiments of the invention.

With reference to FIG. 12, a protective material forming a second protective layer 300 is preferably deposited around and over the spacers 175 and the parts of the layers 150 and 160. The protective material is preferably a photodefinable material such as photoresist. Optionally, an anti-reflective coating (not shown) can be provided under the layer 300, e.g., directly above the substrate 110, to improve photolithography results. The photoresist and the anti-reflective coating can be deposited using various methods known in the art, including spin-on-coating processes.

Figure 13:
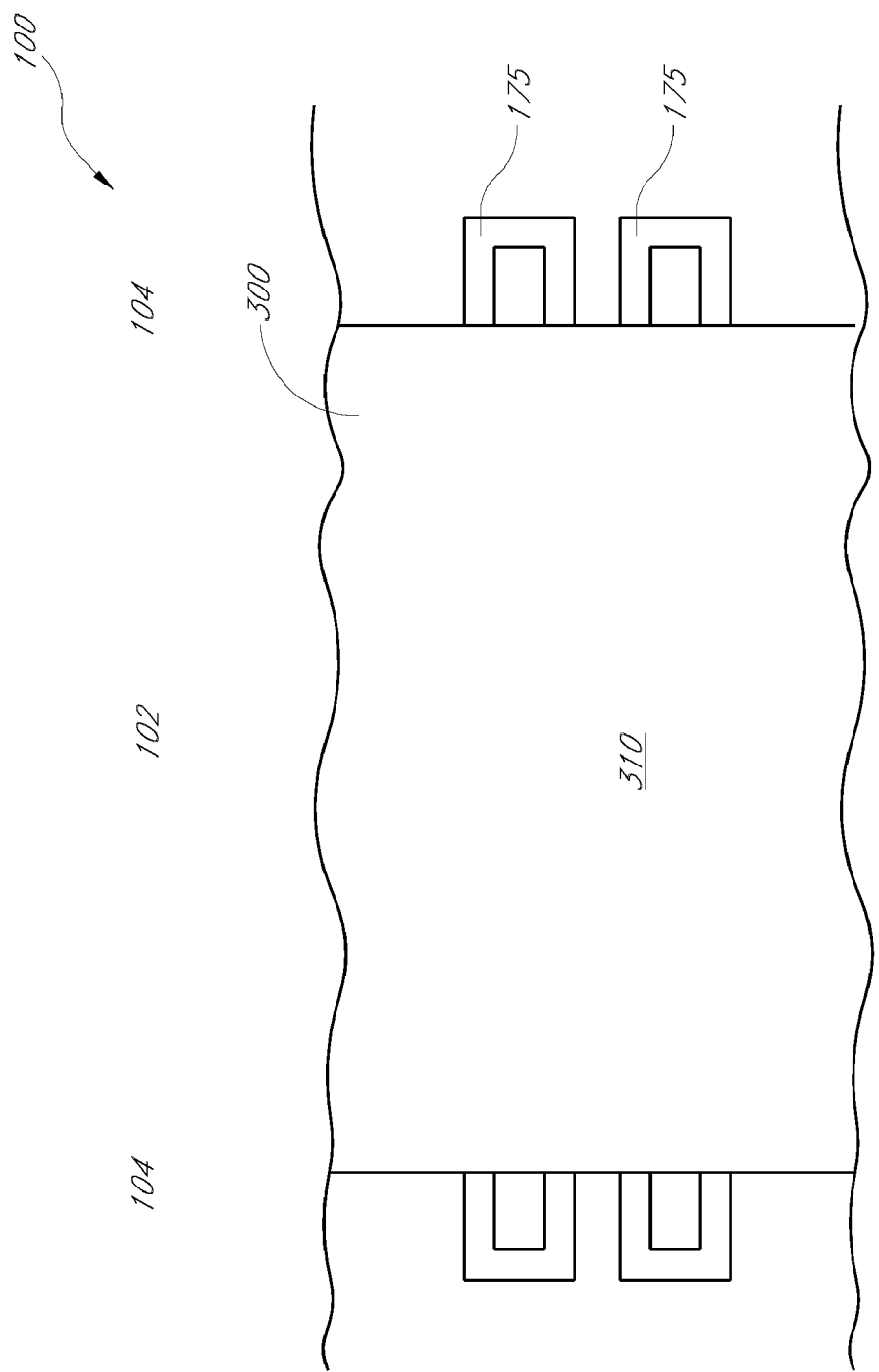
FIG. 13 is a schematic, top plan view of the partially formed integrated circuit of FIG. 12 after patterning the protective layer, in accordance with preferred embodiments of the invention.

With reference to FIG. 13, a protective mask 310 is subsequently patterned in the second protective layer 300, e.g., by photolithography, to protect desired parts of the underlying spacers 175 from a subsequent etch. To separate the spacers 175 of one loop into two separate lines, portions of the loops are exposed for etching in at least two separate locations. To simplify processing, the exposed portions of the loops are preferably the ends of the loops formed by the spacers 175, as illustrated.

In other embodiments, it will be appreciated that the protective layer 300 can be formed of any material that can be selectively removed, e.g., relative to the spacers 175, the layers 150-160 and the substrate 110. In those cases, the protective mask 310 can be formed in another material, e.g., photoresist, overlying the layer 300.

Figure 14A:
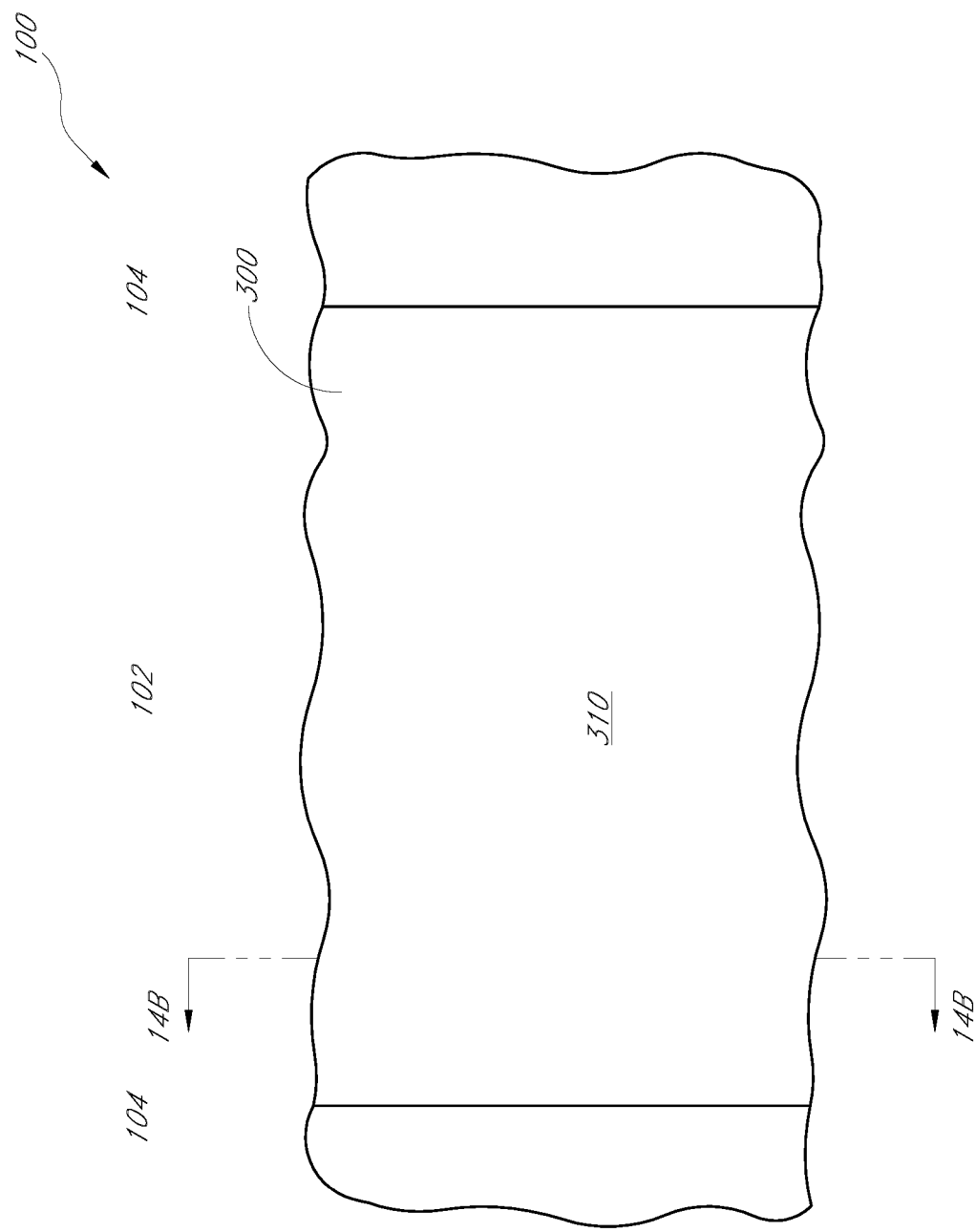
FIGS. 14A-14B are schematic, top plan and cross-sectional side views of the partially formed integrated circuit of FIG. 13 after etching exposed portions of spacers, in accordance with preferred embodiments of the invention.
Figure 14B:
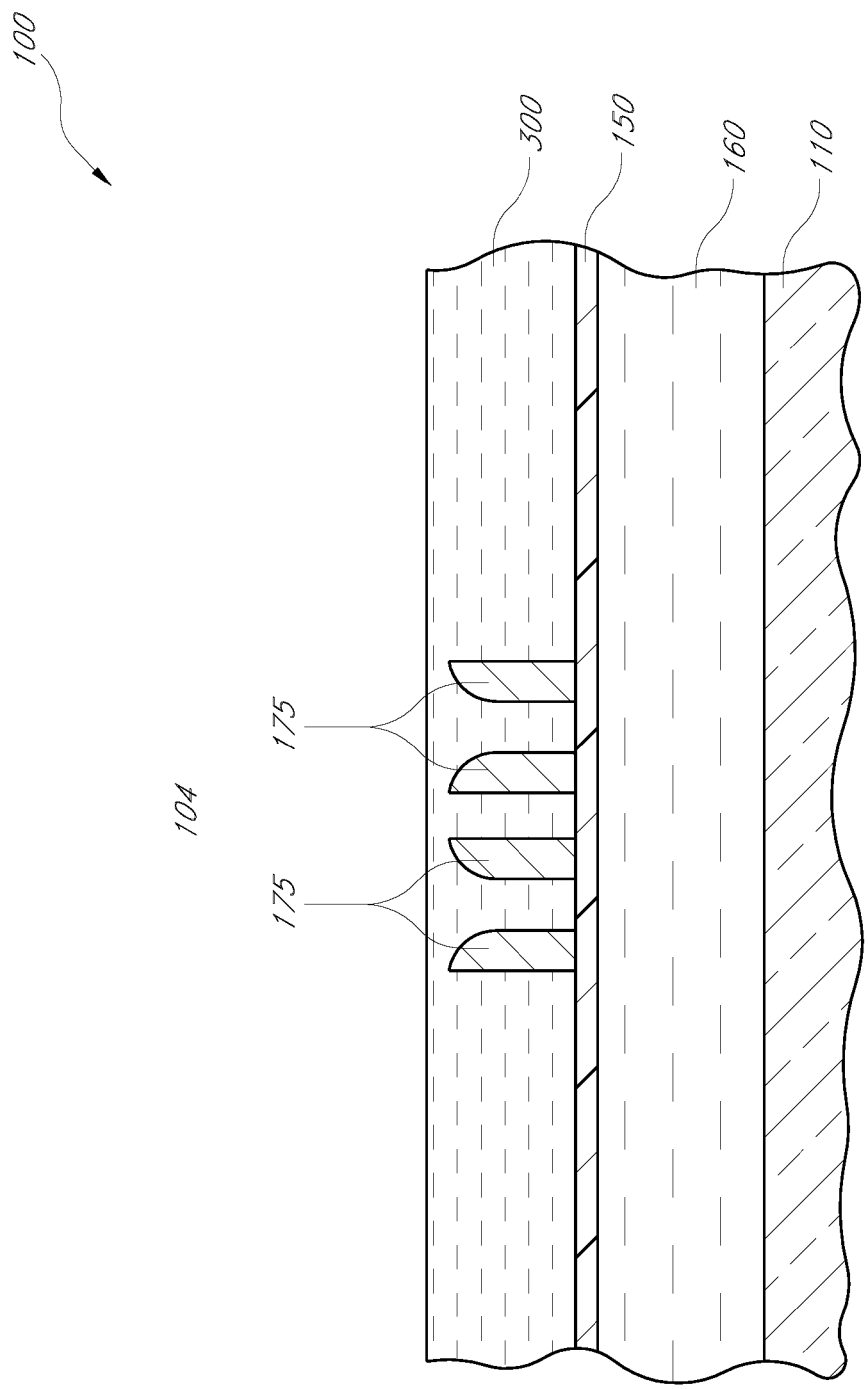

With reference to FIG. 14A, the exposed portions of the spacers 175 are etched away. Where the spacers 175 comprise silicon oxide or nitride, preferred etch chemistries include a fluorocarbon etch. After being etched, the spacers 175 no longer form a loop with a neighboring spacer 175. FIG. 14B shows a side view of the resulting structure, taken along the vertical plane 14B of FIG. 14A.

Figure 15A:
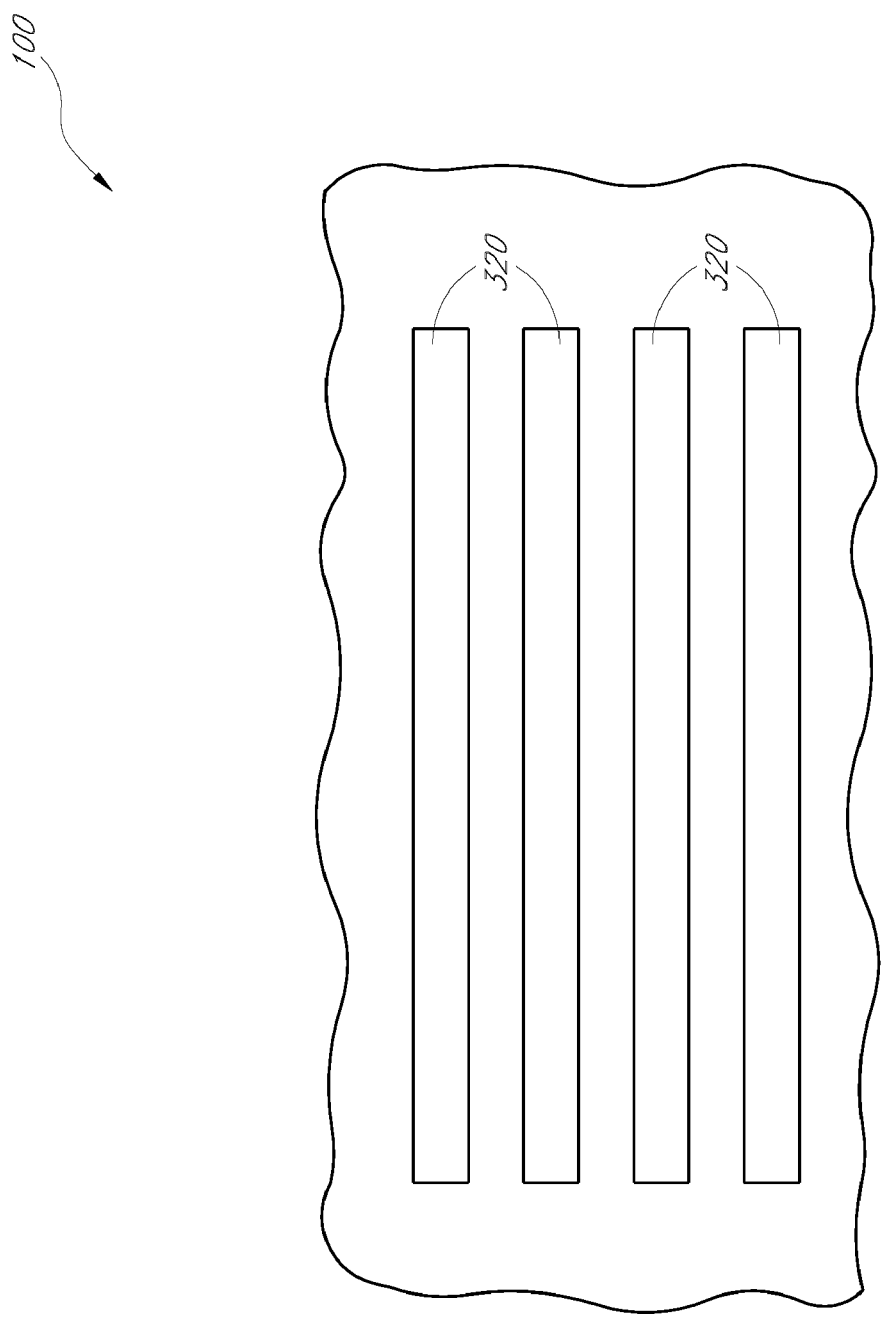
FIGS. 15A-15B are schematic, top plan and cross-sectional side views of the partially formed integrated circuit of FIG. 13 after removing the protective layer, in accordance with preferred embodiments of the invention.
Figure 15B:
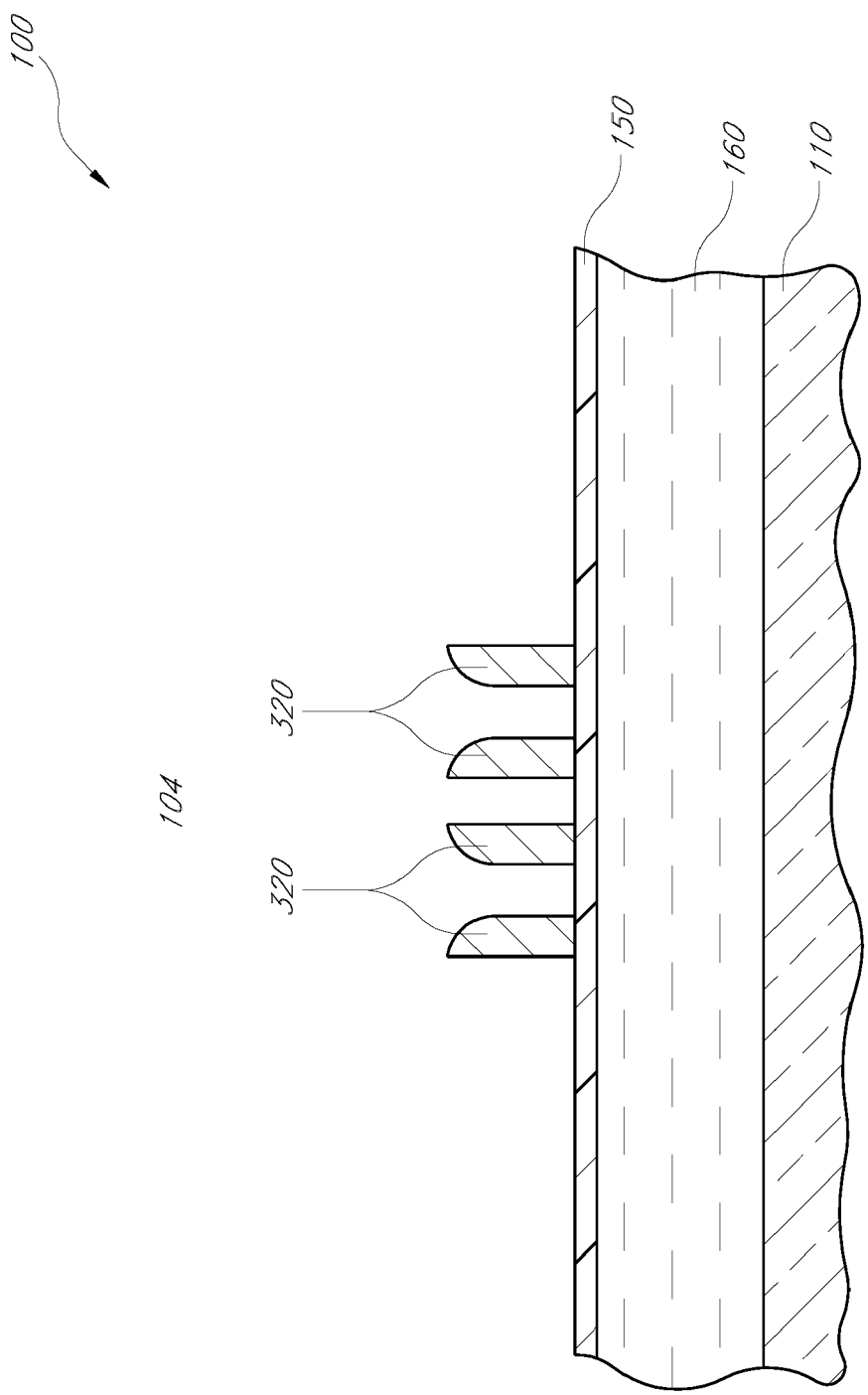

With reference to FIGS. 15A and 15B, the protective material is preferably selectively removed. For example, the partially formed integrated circuit 100 can be subjected to an ash process to remove the protective material. It will be appreciated that the spacers 175 are not attacked during this removal step and that the layer 160 is protected by the second hard mask layer 150. Thus, a plurality of individual mask lines 320 are formed. FIG. 15A shows a top plan view of the resultant structure and FIG. 15B shows a cross-sectional side view taken along the vertical plane 15B of FIG. 15A.

Figure 16:
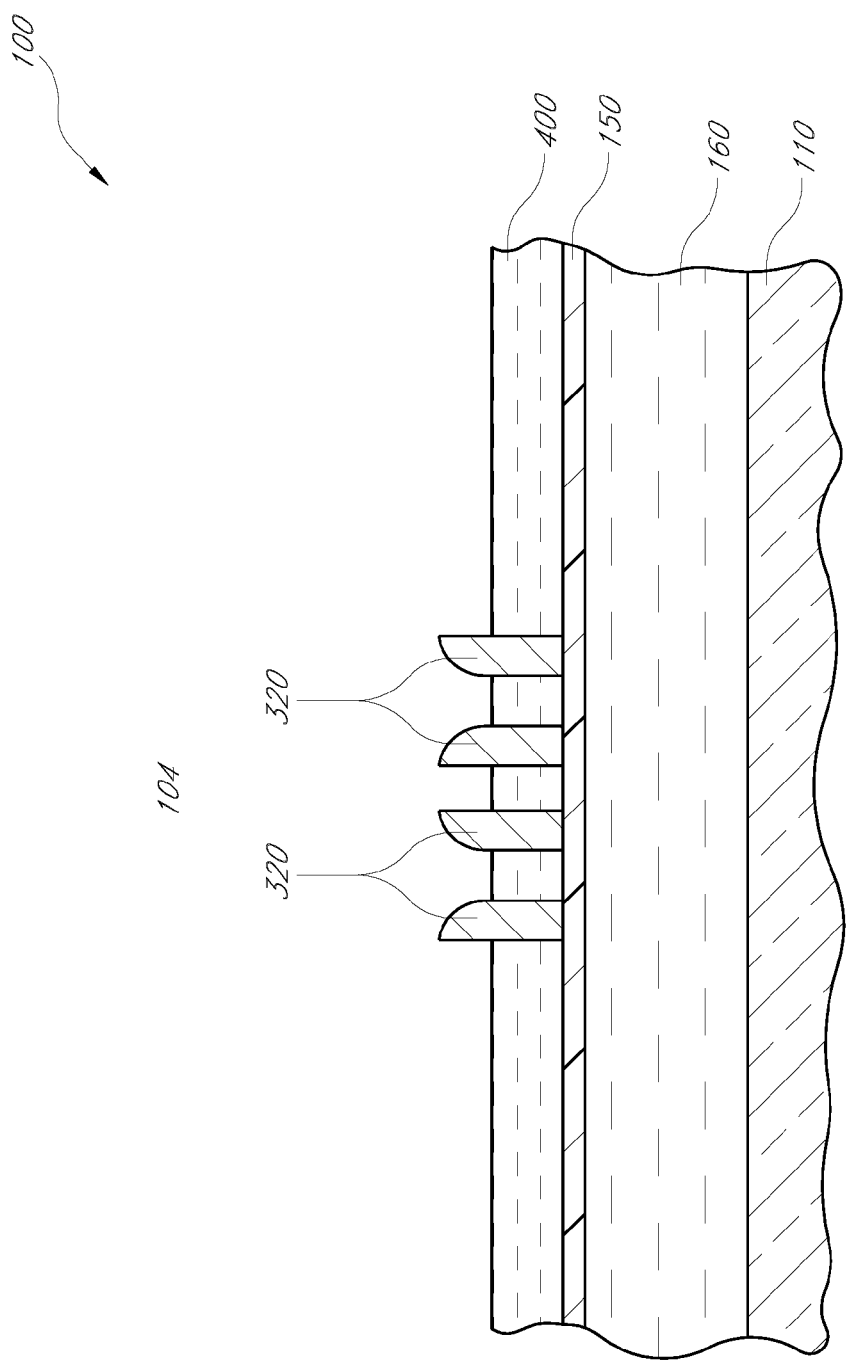
FIG. 16 is a schematic, cross-sectional side view of the partially formed integrated circuit of FIGS. 15A-15B after depositing a photodefinable layer, in accordance with preferred embodiments of the invention.

Next, in a third phase of methods according to the preferred embodiments, a second pattern is stitched or overlapped with the pattern of spacers 320. In the illustrated embodiments, the second pattern is overlaid on the spacers 320 to pattern features that will contact the features defined by the spacers 320. To form this second pattern, a photodefinable layer 400 is preferably formed around the spacers 320, as shown in FIG. 16. The photodefinable layer 400 preferably has a height below the level of the spacers 320. Preferably, the photodefinable layer 400 is formed of photoresist and, more preferably, negative photoresist.

The photoresist can be deposited to the desired height using a scan coating method, such as that commercially available from Tokyo Electron Limited (TEL) of Tokyo, Japan. In other embodiments, a relatively thick layer of photoresist can be deposited and then etched back to the desired height. Preferably, the etch back does not activate PAG's or otherwise detrimentally effect the photoresist for subsequent exposure and development steps. The photodefinable layer 400 is preferably about 80% or less and, more preferably, about 75-50% of the height of the spacers 320.

A pattern corresponding to line extensions or contacts to features to be defined by the spacers 320 is next formed in the photodefinable layer 400. It will be appreciated that the photodefinable layer 400 can be patterned using any photolithographic technique, including the same photolithographic technique used to pattern the photodefinable layer 120. Preferably, the photodefinable layer 400 is patterned using a higher resolution technique than the photodefinable layer 120. For example, where the photodefinable layer 120 is patterned using 248 nm photolithography to form features having a pitch of about 100 nm, the photodefinable layer 400 can be patterned using 193 nm photolithography to form features having a pitch of about 140 nm. Preferably, the photodefinable layer 400 is patterned using a lithographic technique that allows patterning with a pitch less than that of the spacers 320. For example, electron beam lithography, which has high resolution but relatively poor alignment capabilities, can be used to pattern the photodefinable layer 400.

Figure 17A:
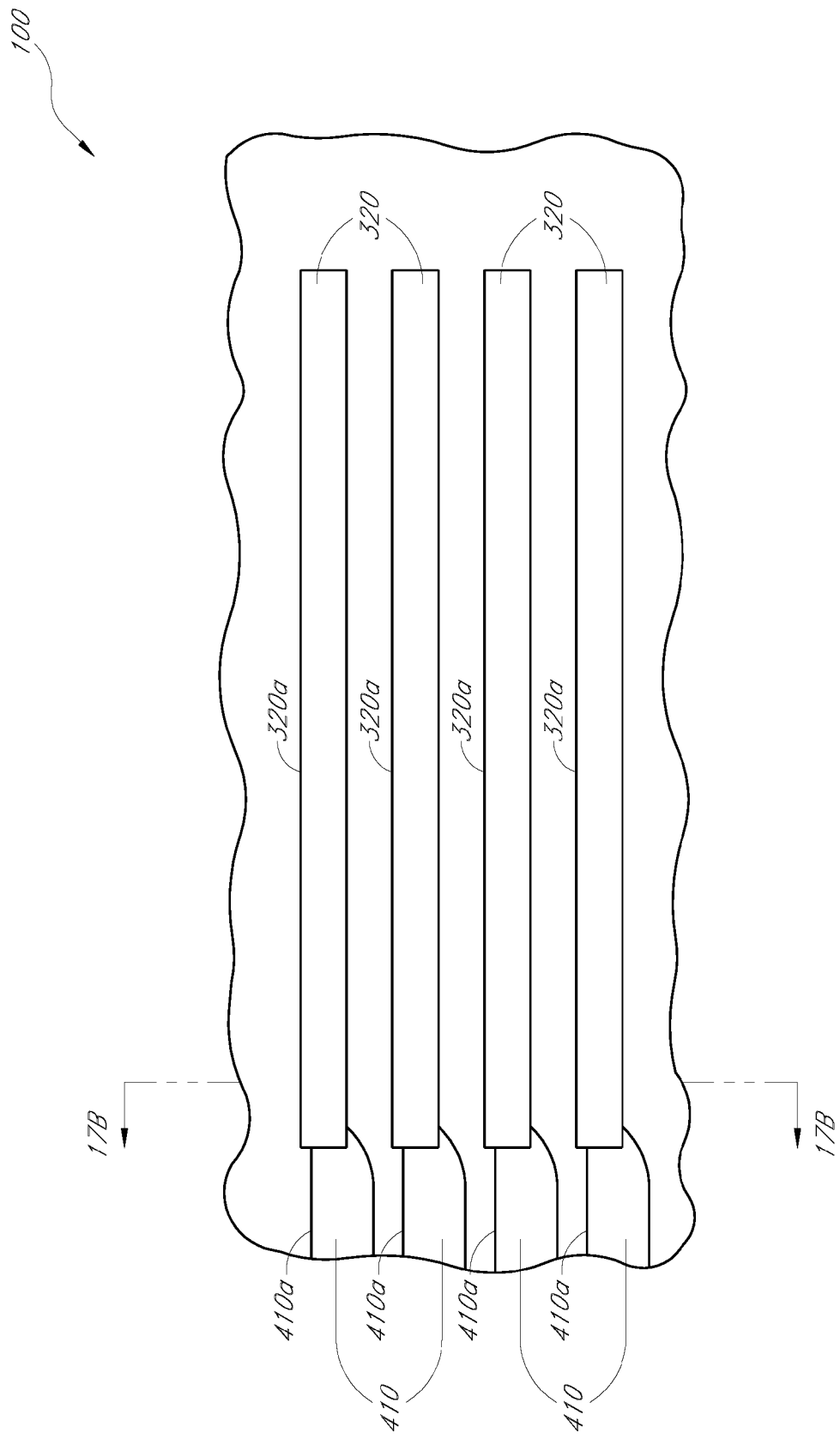
FIGS. 17A-17B are schematic, top plan and cross-sectional side views of the partially formed integrated circuit of FIG. 16 after patterning the photodefinable layer, in accordance with preferred embodiments of the invention.
Figure 17B:
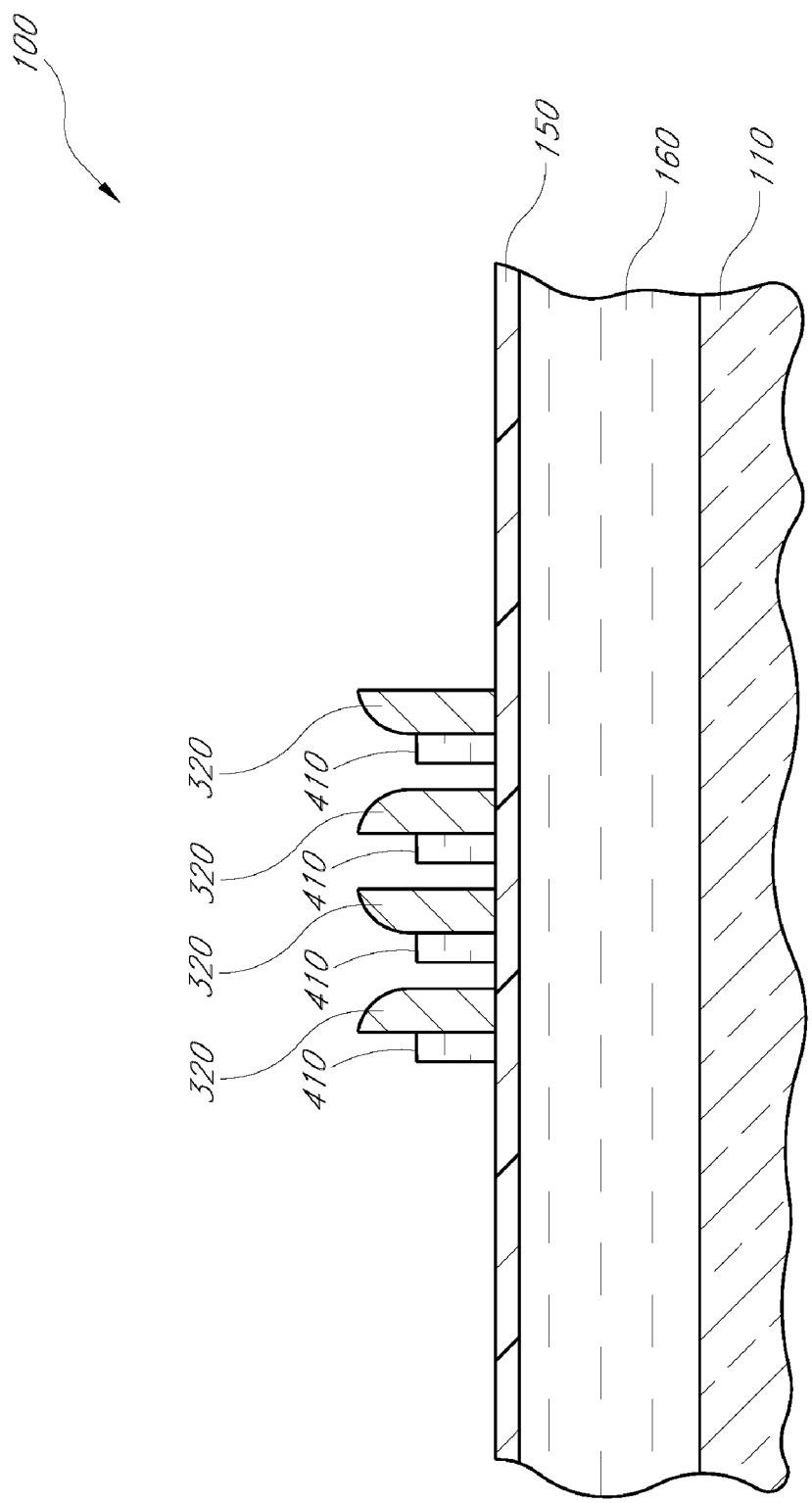

With reference to FIGS. 17A and 17B, a pattern of features 410 is formed in the photodefinable layer 400. It will be appreciated that the features 410 can be used to pattern features of different sizes than the spacers 320, including landing pads, local interconnects, etc. As illustrated, the features 410 preferably overlap the pattern of spacers 320 to ultimately form interconnects that contact interconnects formed using the spacers 320. In the illustrate embodiment, the interconnects formed using the features 410 have a larger critical dimension than those formed using the spacers 320.

FIG. 17A shows a top plan view of the resulting structure, with features 410 and spacers 320. It will be appreciated that the shape of the features 410 correspond to the location of light reaching the photoresist layer 400 (FIG. 16), where the photoresist layer 400 comprises negative photoresist. Where the photoresist layer 400 comprises positive photoresist, light is directed to all areas of the partially fabricated integrated circuit 100, except for the location of the features 410. Due to the corner rounding phenomena discussed above, the shape of the features 410 in the reticle (not shown) can be rectangular, with sharp corners, while still advantageously forming rounded corners. More preferably, the reticle is shaped to ensure rounding of the corners, especially where positive photoresist is used.

In addition, the reticle can be positioned so that the features 410 align with one of their long sides 410a inset from the corresponding long sides 320a of the spacers 320 to ensure that the sides 410a do not extend beyond the sides 320a. Thus, while illustrated inset from the sides 320a a certain distance, in other embodiments, due to the limitations of photolithography, the sides 410a may be further inset from the sides 320a or may be collinear with the sides 320a. Preferably, however, a targeted or desired position of the sides 410a is collinear with or slightly inset from the sides 320a.

As known in the art, the photoresist is developed after being irradiated, leaving the pattern of features 410 shown. FIG. 17B shows a cross-sectional side view of the partially fabricated integrated circuit 100, taken along the vertical plane 17B of FIG. 17A.

Figure 18:
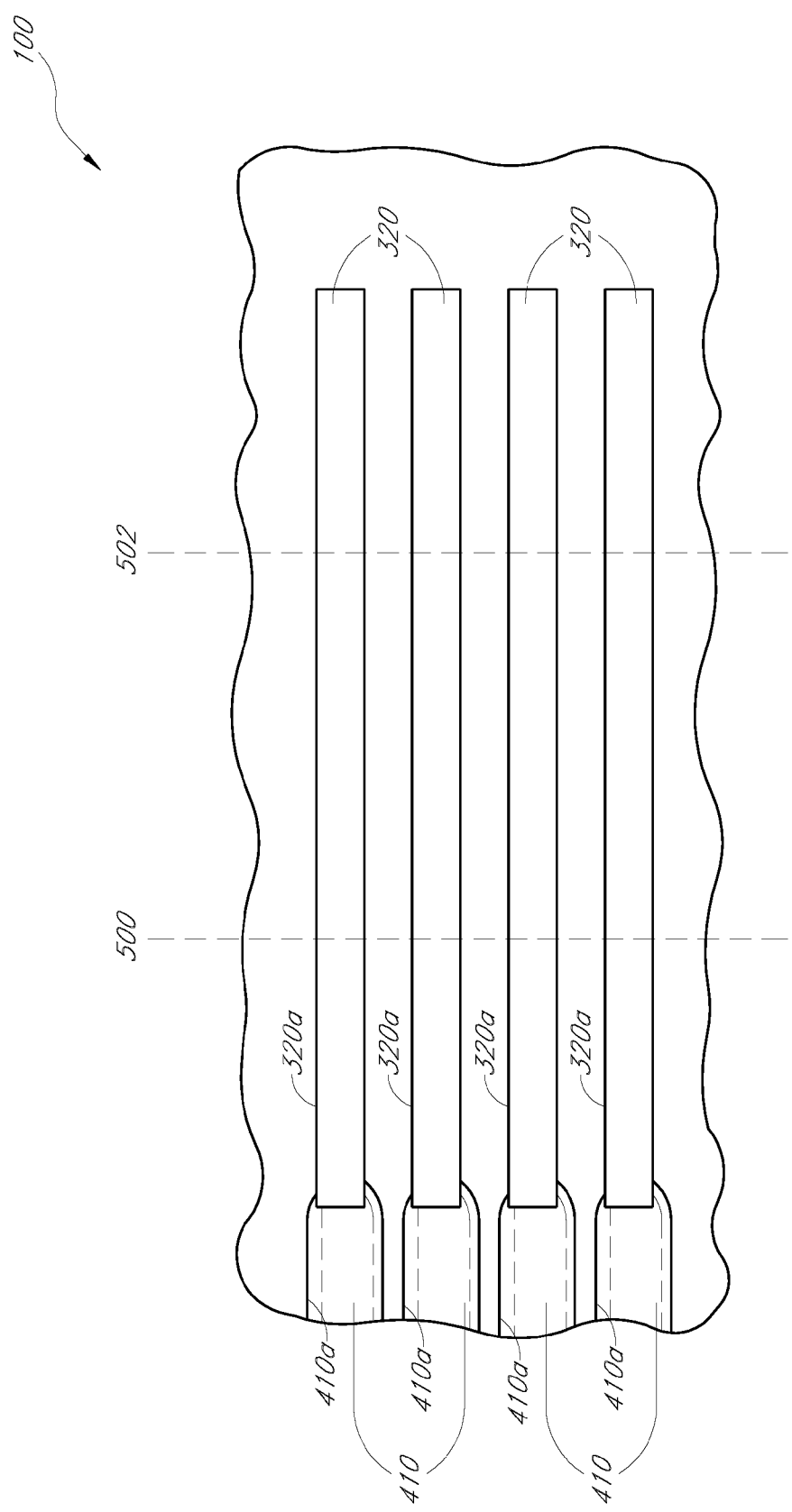
FIG. 18 is a schematic, top plan view of the partially formed integrated circuit of FIGS. 17A-17B showing overdevelopment of the photodefinable layer, in accordance with some preferred embodiments of the invention.

With reference to FIG. 18, in some embodiments the features 410 may be larger than desired (solid line) or may be positioned beyond the sides 410a. In such cases, the photoresist layer 400 can be overdeveloped to further narrow those features to a desired size (dotted line) and/or position.

Figure 19:
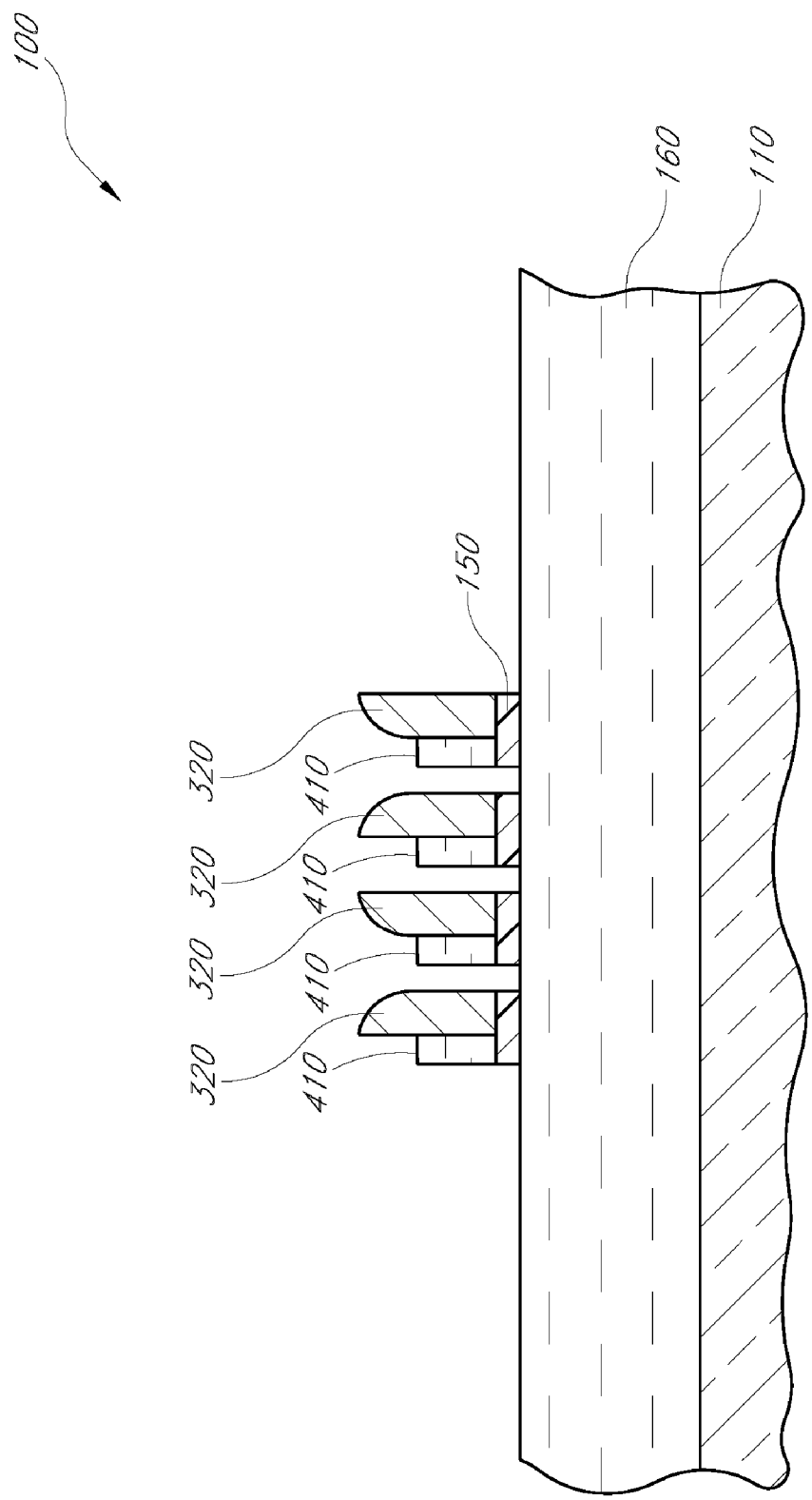
FIG. 19 is a schematic, cross-sectional side view of the partially formed integrated circuit of FIGS. 17A-17B after etching through a hard mask layer, in accordance with preferred embodiments of the invention.
Figure 20:
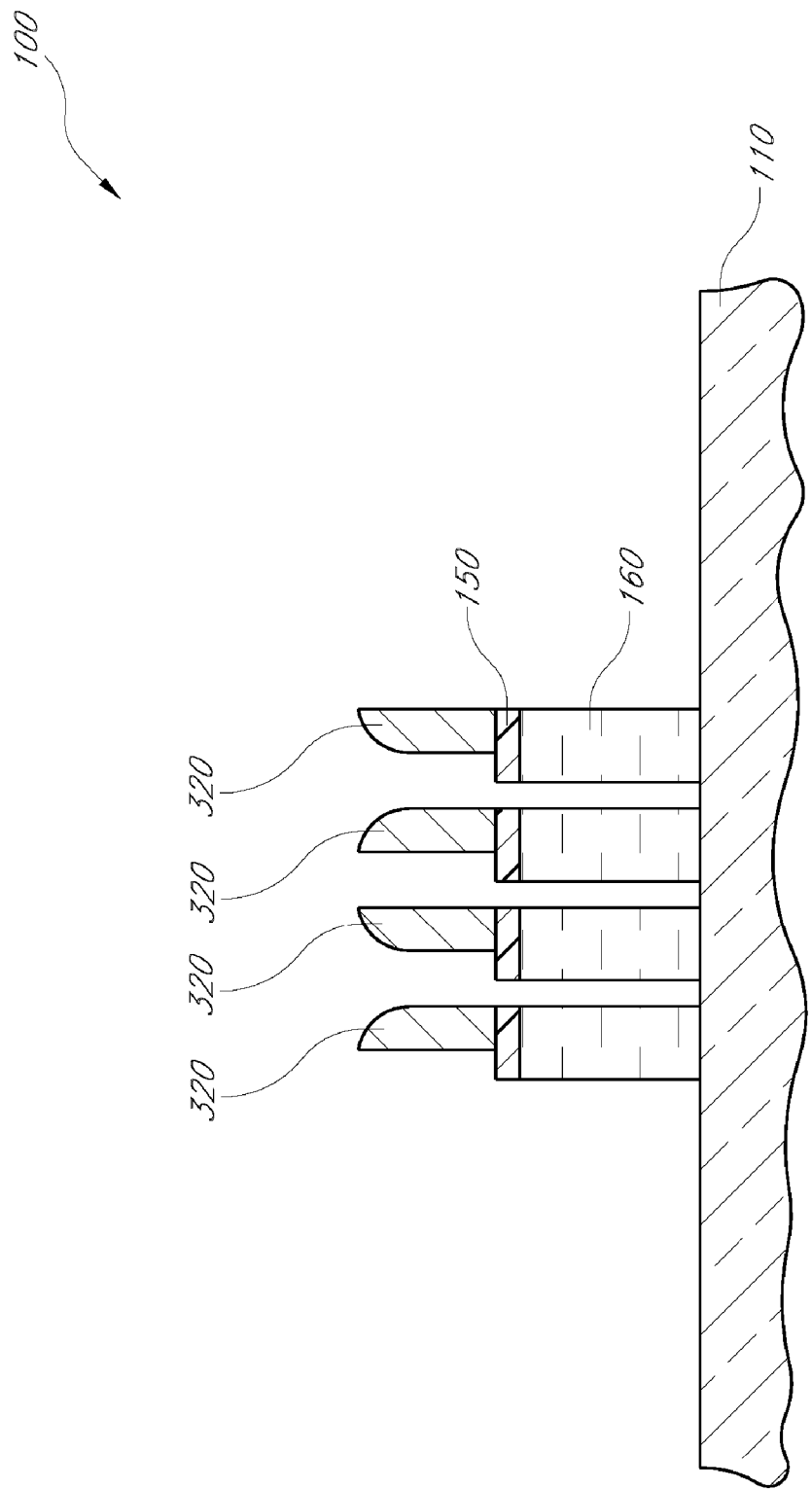
FIG. 20 is a schematic, cross-sectional side view of the partially formed integrated circuit of FIG. 18 after etching the additional masking layer, in accordance with preferred embodiments of the invention.

The pattern of features 410 and spacers 320 can next be transferred to the additional mask layer 160. Preferably, the additional mask layer 160 comprises a material having good etch selectivity to the material(s) of the substrate 110, and vice versa, to allow for an effective transfer and later mask removal. To transfer to the pattern, the hard mask layer 150 overlying the additional mask layer 160 is first etched (FIG. 19). The hard mask layer 150 is preferably anisotropically etched, preferably using a fluorocarbon plasma. Alternatively, an isotropic etch may be used if the hard mask layer 150 is relatively thin. While not shown, it will be understood that in the array region 102, the hard mask 150 remains only directly under the spacers 320. The additional mask layer 160 is then anisotropically etched, preferably using a $SO_2$-containing plasma, which can simultaneously remove the features 410. FIG. 20 shows a schematic side view of the resulting partially formed integrated circuit 100 in the region of overlap between the two patterns. The pattern in the additional mask layer 160 can then be transferred to the substrate 110. Given the disparate materials typically used for the additional mask layer 160 and the substrate 110 (e.g., amorphous carbon and silicon or silicon compounds, respectively), the pattern transfer can be readily accomplished using conventional etches appropriate for the material or materials of the substrate 110.

Figure 21:
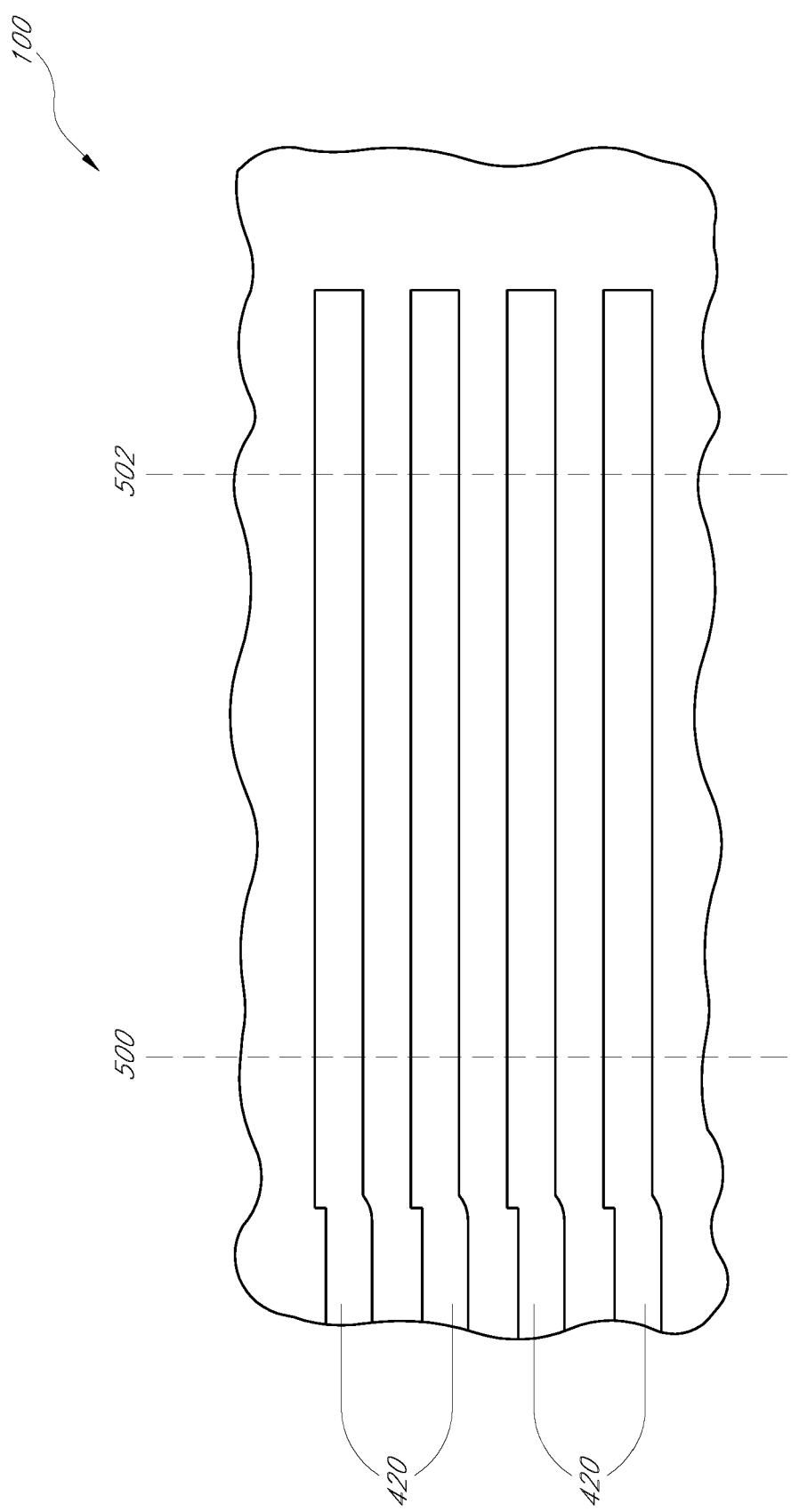
FIG. 21 is a schematic, top plan view of the partially formed integrated circuit of FIG. 20 after forming conductive interconnects in the substrate, in accordance with preferred embodiments of the invention.

Preferably, the substrate 110 comprises a conductor suitable for acting as electrical interconnects between electrical devices. For example, the substrate comprises doped silicon or a metal layer, such as an aluminum or copper layer. Thus, the mask lines 320 and 410 can directly correspond to the desired-placement of interconnects in the substrate 110. FIG. 21 shows a resulting structure, with interconnects 420 formed in the partially formed integrated circuit 100. In other embodiments, the substrate can be an insulator and the location of mask features can correspond to the desired location of insulators in an integrated circuit.

It will be appreciated that formation of contacts according to the preferred embodiments offers numerous advantages. For example, because the spacers 320 block photogenerated chemicals, such as acid from PAG's, from diffusing in one direction, the features 410 are prevented from growing in that direction in the region of contact with the spacers 320. Thus, the misalignment tolerance, especially in the direction in which diffusion is blocked, may be thought of as increasing by the amount that the features 410 would have otherwise expanded. In the other direction, the rounding of the corners, due partially to shadowing from the taller spacers extending above the second resist layer, also increases the misalignment tolerance by increasing the distance between the spacers 320 and the features 410. Moreover, given that diffusion is prevented in one direction, any misalignment can be weighted in that direction, since further expansion in that direction is minimized, especially where the photoresist is overdeveloped. Because the features 410 preferably contact the spacers 320 both at butting ends and from the side, a relatively high contact area can be achieved. Preferably, as illustrated, the spacers 320 form a boundary for exactly two faces of the features 410, e.g., line end faces and on one side of the features 320. Moreover, a high contact area can advantageously be maintained even after trimming by overdevelopment. For example, if the features 410 were centered on the spacers 320, trimming may leave the features 410 only contacting the spacers 320 ends. The off-set positioning above, however, allows the features 410 to contact the spacers 320 both at butting ends and from the side, thereby increasing the contact area between those two parts.

It will be appreciated that, in any of the steps described herein, transferring a pattern from a first level to a second level involves forming features in the second level that generally correspond to features on the first level. For example, the path of lines in the second level will generally follow the path of lines on the first level and the location of other features on the second level will correspond to the location of similar features on the first level. The precise shapes and sizes of features can vary from the first level to the second level, however. For example, depending upon etch chemistries and conditions, the sizes of and relative spacings between the features forming the transferred pattern can be enlarged or diminished relative to the pattern on the first level, while still resembling the same initial "pattern." Thus, the transferred pattern is still considered to be the same pattern as the initial pattern. In contrast, forming spacers around mask features can change the pattern.

It will also be appreciated that various modifications of the illustrated embodiments are possible. For example, the pitch of the spacers 320 can be more than doubled. For example, further pitch multiplication can be accomplished by forming additional spacers around the spacers 320, then removing the spacers 320, then forming spacers around the spacers that were formerly around the spacers the 175, and so on. An exemplary method for further pitch multiplication is discussed in U.S. Pat. No. 5,328,810 to Lowrey et al.

In addition, while illustrated equally spaced for ease of illustration, the spacers 320 or the features 410 can each be spaced at varying distances to each other. Moreover, while all are illustrated contacting the spacers 320 from the same side, some of the features 410 can be positioned on different, e.g., sides. Moreover, while illustrated parallel over their entire lengths for illustrate, the distance between the spacers 320 can vary over some or all of their lengths. Preferably, however, the spacers 320, and resulting interconnects 420, are parallel over some distance, e.g., between first and second planes 500 and 502 extending perpendicular to the spacers 320 (FIGS. 18 and 21). For example, the illustrated spacers 320 are preferably parallel in the array region 102 of a DRAM to connect the tightly packed memory cells in that array region. In addition, various parts of the spacers 320 can be formed at angles relative to other parts of the spacers 320. Similarly, parts of the features 410 can be formed at angles relative to the spacers 320 or to other parts of the features 410. For example, the features 410 can diverge away from the points of contact with the spacers 320 to allow for increased separation between those features.

Also, more than two patterns, e.g., corresponding to landing pads and interconnects, can be consolidated on a mask layer before transferring the consolidated pattern to the substrate. In some embodiments, additional mask layers can be deposited above the layer 150. For example, patterns corresponding to landing pads and additional interconnects can be transferred to a supplemental mask layer (not shown) overlying the hard mask layer 150 and then an overlying photodefinable layer (not shown) can be patterned and the pattern transferred to underlying layers. The substrate 110 can then be processed through the resulting mask pattern.

It will be appreciated that while "processing" through the various mask layers preferably involve etching an underlying layer, processing through the mask layers can involve subjecting layers underlying the mask layers to any semiconductor fabrication process. For example, processing can involve ion implantation, diffusion doping, depositing, or wet etching, etc. through the mask layers and onto underlying layers. In addition, the mask layers can be used as a stop or barrier for chemical mechanical polishing (CMP) or CMP can be performed on the mask layers to allow for both planarizing of the mask layers and etching of the underlying layers.

It will also be appreciated that while the preferred embodiments will find application in any context in which features in different mask patterns are overlaid one other, in particularly advantageous embodiments, features formed by pitch multiplication or employing spacers on soft or hard masks are "stitched" or aligned with features formed by a masking technique with a lower resolution. Preferably, pitch multiplied mask features are made to contact features formed by conventional photolithography. Thus, the pitch multiplied features preferably have a pitch below the minimum pitch of the photolithographic technique used for patterning the other features. In addition, while the preferred embodiments can be used to form any integrated circuit, they are particularly advantageously applied to form devices having arrays of electrical devices, including logic or gate arrays and volatile and non-volatile memory devices such as DRAM, ROM or flash memory.

Moreover, the principles and advantages discussed herein are applicable to a variety of contexts in which two or more adjacent mask patterns are to be mated within overlapping regions.

Accordingly, it will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A method for integrated circuit fabrication, comprising:
   providing a plurality of mandrels over a substrate;
   depositing a blanket layer of spacer material over the mandrels;
   anisotropically etching the blanket layer to form spacers on sidewalls of the mandrels;
   selectively removing the mandrels to form a plurality of free-standing spacers;

depositing negative photoresist on a same level as the free-standing spacers, the negative photoresist contacting the spacers;

patterning the negative photoresist;

transferring a pattern defined by the free-standing spacers and the patterned negative photoresist to an underlying hard mask layer; and transferring the pattern to the substrate.

2. The method of claim 1, wherein depositing negative photoresist leaves a layer of negative photoresist having a top surface below a topmost part of the spacers.

3. The method of claim 1, wherein patterning the negative photoresist defines mask lines, wherein each of the mask lines are wider than each of the spacers, wherein each of the lines contact each of the spacers and are aligned with one long side inset from or collinear with a corresponding long side of the spacer contacted by the line.

4. The method of claim 3, wherein the long sides of the lines are substantially co-linear with the long sides of the spacers.

5. The method of claim 1, further comprising transferring the pattern to a primary hard mask layer after transferring the pattern to the underlying hard mask layer and before transferring the pattern to the substrate.

6. The method of claim 1, wherein the mandrels are formed of a carbon-containing material.

7. The method of claim 6, wherein the mandrels are formed of amorphous carbon.

8. The method of claim 6, wherein depositing the blanket layer comprises depositing the spacer material by atomic layer deposition.

9. The method of claim 1, wherein the underlying hard mask layer comprises amorphous carbon.

10. A method for fabricating an integrated circuit, comprising:

forming a plurality of mask features in an array region of a partially fabricated integrated circuit;

depositing a negative photoresist layer on a same level as the mask features;

patterning the negative photoresist to define additional mask features in a periphery region of the partially fabricated integrated circuit;

transferring a pattern defined by the mask features and the additional mask features to an underlying substrate.

11. The method of claim 10, wherein the negative photoresist layer has a thickness less than a height of the mask features.

12. The method of claim 11, wherein the thickness of the photodefinable layer is about 80% or less than a height of the mask features.

13. The method of claim 12, wherein the thickness of the photodefinable layer is about 75-50% of the height of the mask features.

14. The method of claim 10, further comprising etching back the deposited photoresist after depositing the negative photoresist layer and before patterning the negative photoresist.

15. The method of claim 10, wherein the mask features extend in spaced, generally parallel relation to one another.

16. The method of claim 10, wherein forming the plurality of mask features comprises performing pitch multiplication.

17. A method for integrated circuit fabrication, comprising:

providing a plurality of mask features in an array region of a partially fabricated integrated circuit;

depositing a negative photoresist layer on a same level as the mask features;

patterning the negative photoresist to define additional mask features in a periphery region of the partially fabricated integrated circuit, the additional mask features having a larger critical dimension than the mask features;

transferring a pattern defined by the mask features and the additional mask features to an underlying substrate.

18. The method of claim 17, wherein transferring the pattern to the substrate defines conductive interconnects, the mask features defining a plurality of first conductive interconnects, wherein the additional mask features define a plurality of second conductive interconnects.

19. The method of claim 18, wherein an end of each of the first conductive interconnects abuts an end of each of the second conductive interconnects.

20. The method of claim 19, wherein the ends of the second conductive interconnects contact an entire width of the ends of the first conductive interconnects.

21. The method of claim 18, wherein the ends of the second conductive interconnects contact less than an entire width of the ends of the first conductive interconnects.

22. The method of claim 20, wherein the ends of the second conductive interconnects partially overlap the ends of the first conductive interconnect.

23. A method for integrated circuit fabrication, comprising:

providing a plurality of mask features over a substrate;

providing a negative photoresist layer on a same level as the mask features;

patterning the negative photoresist to define additional mask features by exposing selected regions of the negative photoresist to light, the additional mask features having a larger critical dimension than the mask features, wherein patterning the negative photoresist rounds only a single corner of each additional mask feature in an interface region between the mask features and the additional mask features.

24. The method of claim 23, wherein the mask features are disposed in an array region of a partially fabricated integrated circuit and the additional mask features are disposed in a periphery region of the partially fabricated integrated circuit.

25. The method of claim 23, wherein a height of the mask features is selected to cast a shadow on the negative photoresist during patterning the negative photoresist, thereby causing rounding of the single corner of each mask feature.

* * * * *

UNITED STATES PATENT AND TRADEMARK OFFICE
CERTIFICATE OF CORRECTION

PATENT NO.        : 7,455,956 B2                                           Page 1 of 1
APPLICATION NO. : 11/691192
DATED             : November 25, 2008
INVENTOR(S)       : Sandhu et al.

It is certified that error appears in the above-identified patent and that said Letters Patent is hereby corrected as shown below:

In column 18, line 29, in Claim 21, delete "18," and insert -- 19, --, therefor.

In column 18, line 32, in Claim 22, delete "20," and insert -- 21, --, therefor.

Signed and Sealed this

Third Day of March, 2009

JOHN DOLL
*Acting Director of the United States Patent and Trademark Office*